United States Patent
Takatori et al.

(10) Patent No.: US 8,217,920 B2
(45) Date of Patent: Jul. 10, 2012

(54) DATA-HOLDING CIRCUIT AND SUBSTRATE FOR A DISPLAY DEVICE

(75) Inventors: Kenichi Takatori, Tokyo (JP); Hiroshi Haga, Tokyo (JP)

(73) Assignees: NEC Corporation, Tokyo (JP); NLT Technologies, Ltd., Kanagawa (JP)

( * ) Notice: Subject to any disclaimer, the term of this patent is extended or adjusted under 35 U.S.C. 154(b) by 1376 days.

(21) Appl. No.: 11/437,929

(22) Filed: May 19, 2006

(65) Prior Publication Data

US 2007/0115229 A1    May 24, 2007

(30) Foreign Application Priority Data

Nov. 21, 2005 (JP) .................................. 2005-336426

(51) Int. Cl.
*G09G 5/00* (2006.01)
(52) U.S. Cl. ........ 345/204; 345/205; 345/206; 349/149; 349/158
(58) Field of Classification Search ............ 345/87–104, 345/204–215; 349/149–152, 158–160
See application file for complete search history.

(56) References Cited

U.S. PATENT DOCUMENTS

| | | | | |
|---|---|---|---|---|
| 4,222,112 A * | 9/1980 | Clemons et al. | ............. | 365/203 |
| 5,030,585 A * | 7/1991 | Gonzalez et al. | ............. | 438/210 |
| 5,179,460 A * | 1/1993 | Hinata et al. | ............. | 349/149 |
| 5,403,762 A * | 4/1995 | Takemura | ............. | 438/164 |
| 5,640,216 A * | 6/1997 | Hasegawa et al. | ............. | 349/58 |
| 6,025,901 A * | 2/2000 | Adachi et al. | ............. | 349/151 |
| 6,366,334 B1 * | 4/2002 | Inou et al. | ............. | 349/187 |
| 6,496,240 B1 * | 12/2002 | Zhang et al. | ............. | 349/116 |
| 6,501,528 B1 * | 12/2002 | Hamada | ............. | 349/158 |
| 6,593,592 B1 * | 7/2003 | Yamazaki et al. | ............. | 257/71 |
| 6,624,473 B1 * | 9/2003 | Takehashi et al. | ............. | 257/344 |
| 6,654,083 B1 * | 11/2003 | Toda et al. | ............. | 349/110 |
| 6,831,725 B2 * | 12/2004 | Niiya | ............. | 349/153 |

(Continued)

FOREIGN PATENT DOCUMENTS

CN 1394293 1/2003

(Continued)

OTHER PUBLICATIONS

Office Action, Chinese Patent Application No. 200610084410.4, dated May 9, 2008 (with English Translation).

(Continued)

*Primary Examiner* — Lun-Yi Lao
*Assistant Examiner* — Gene W Lee
(74) *Attorney, Agent, or Firm* — Michael Best & Friedrich LLP

(57) ABSTRACT

A display device has a data-holding circuit with a capacitance and a display portion with a plurality of pixel electrodes, formed on a first carrier substrate. In the display device, a second carrier substrate disposed opposite the first carrier substrate is placed above the display portion, but the opposing substrate is not present above the area in which the data-holding circuit is disposed. The parasitic capacitance of the data-holding circuit can thereby be reduced. Therefore, the capacitance in the data-holding circuit can be reduced and the area required can be reduced as well. The display data of all the pixels is sent serially to the liquid crystal module without high-speed transfer for each frame time interval, and size can be reduced because the controller IC and interface circuit are formed on the same substrate as the display device substrate.

4 Claims, 14 Drawing Sheets

U.S. PATENT DOCUMENTS

| | | | |
|---|---|---|---|
| 6,864,947 B2* | 3/2005 | Shiraishi | 349/158 |
| 2001/0012089 A1* | 8/2001 | Shiraishi | 349/153 |
| 2002/0067632 A1* | 6/2002 | Batson et al. | 365/49 |
| 2004/0233379 A1* | 11/2004 | Kinoshita et al. | 349/158 |
| 2005/0073526 A1* | 4/2005 | Nose et al. | 345/531 |

FOREIGN PATENT DOCUMENTS

| | | |
|---|---|---|
| JP | 09-269511 | 10/1997 |
| JP | 10-091759 | 4/1998 |
| JP | 11-085065 | 3/1999 |
| JP | 2001-148194 | 5/2001 |
| JP | 2002-082656 | 3/2002 |
| JP | 2002-156954 | 5/2002 |
| JP | 2002-318554 | 10/2002 |
| JP | 2004-046054 | 2/2004 |
| JP | 2004-235586 | 8/2004 |
| JP | 2004-272638 | 9/2004 |
| JP | 2004-311984 | 11/2004 |
| JP | 2005-010448 | 1/2005 |
| JP | 2005-519344 | 6/2005 |
| JP | 2005-196949 | 7/2005 |
| JP | 2005-244212 | 9/2005 |

OTHER PUBLICATIONS

Japanese Office Action, received in Japanese Patent Application No. 2005-336426, mailed Jul. 26, 2011 (with English translation).

* cited by examiner

CAPACITANCE

DATA-HOLDING CIRCUIT AND SUBSTRATE FOR A DISPLAY DEVICE

CROSS REFERENCE TO RELATED APPLICATIONS

This application claims foreign priority of Japanese Patent Application No. 2005-336426, filed Nov. 21, 2005.

BACKGROUND OF THE INVENTION

1. Field of the Invention

The present invention relates to a display device used in projectors, laptop $PC_s$, monitors, mobile phones, PDAs, and the like, and to an apparatus that uses this display device.

2. Description of the Related Art

Conventionally, drive circuits and various other circuits in display devices are configured with an LSI or the like that is made by using silicon technology, and are disposed outside of the display device. However, as technology has developed in recent times, the drive circuits and various other circuits have come to be mounted on a carrier substrate of the display devices, and display devices mounted with these circuits are being brought into practical use. A known example of a display device with such a circuit internally mounted is a display device in which the circuits are configured with a high-temperature polysilicon TFT (Thin Film Transistor) that is formed by a high-temperature process in which a high-cost quartz substrate is used as the carrier substrate. Also being placed in practical use are display devices in which circuits are mounted on a glass substrate or the like by using low-temperature polysilicon technology, whereby a precursor film is formed with a low-temperature process, and the precursor film is annealed using a laser or the like to produce a polycrystalline structure.

A specific example is the active matrix display device disclosed in FIGS. 37 and 38 of Japanese Laid-Open Patent Application No. 2004-046054. FIG. 1 is a block diagram showing the structure of the display system of the conventional common drive circuit-integrated liquid crystal display device described in FIG. 37 of Japanese Laid-Open Patent Application No. 2004-046054.

Referring to FIG. 1, integrally formed by polysilicon TFT on a display device substrate 101 in a conventional drive circuit-integrated liquid crystal display device are an active matrix display area 110 in which M rows and N columns of pixels are disposed and wired in the form of a matrix, a row scanning circuit (scan line (gate line) drive circuit) 109, a column scanning circuit (data line drive circuit) 3504, an analog switch 3505, a level shifter 3503, and other components.

Also, mounted outside the display device substrate 101 is an integrated circuit chip (IC chip) in which a controller 113, memory 111, digital analog converter circuit (DAC circuit) 3502, scanning circuit/data register 3501, and other components are formed on a single-crystal silicon wafer as a controller IC (Integrated Circuit) 102. An interface circuit 114 is formed on a system-side circuit substrate 104 and is connected to the controller 113 and memory 111.

Also present in a conventional drive circuit-integrated liquid crystal display device structured with polysilicon TFT is a device integrally formed with a circuit that is more complicated than a DAC circuit and the like. FIG. 2 is a block diagram showing the structure of the display system of a conventional drive circuit-integrated liquid crystal display device with an internally mounted DAC circuit described in FIG. 38 of Japanese Laid-Open Patent Application No. 2004-046054.

In a conventional drive circuit-integrated liquid crystal display device with an internally mounted DAC circuit, in the same manner as the device in FIG. 1 that does not have an internally mounted DAC circuit, integrally formed on the display device substrate 101 are an active matrix display area 110 in which M rows and N columns of pixels are disposed and wired in the form of a matrix, a row scanning circuit 109, and a column scanning circuit 3504, and additionally integrally formed are a data register 3507, a latch circuit 105, a DAC circuit 106, a selector circuit 107, a level shifter (D bit) 108, and other components.

A controller IC 103 that is mounted outside of the display device substrate 101 of the drive circuit-integrated liquid crystal display device with an internally mounted DAC circuit does not include a high-voltage DAC circuit 3502, and it is possible to configure the memory 111, output buffer circuit 112, and controller 113 all with low-voltage circuits and elements. As a result, a controller IC 103 can be fabricated without the simultaneous use of high-voltage processes that require voltage signals to be generated for writing to the liquid crystal. Therefore, the cost of the controller can be made lower than that of the controller IC 102 in which the DAC circuit 3502 described above is also mounted.

However, the drive circuit-integrated liquid crystal display devices of the prior art transfer display data of all of the pixels to the liquid crystal module serially at high speed for each frame time interval. Therefore, as a result of higher definition, the required transfer rate commensurate with the increase in the number of pixels becomes much higher. And for high speed transfer, the driver IC also must operate at higher speed, a through-current or the like is generated in the large number of CMOS (Complementary Metal Oxide Semiconductor) components constituting the circuit elements, and power consumption increases together with the increase in operating speed. $IC_s$ that operate at high speed also have higher cost. The complexity and transfer speed of the circuit structure then increases when the gradation increases, leading to further increases in power consumption and higher costs. More specifically, since the price and power consumption of the driver IC increase together with higher definition and higher gradation of displays, there is a problem in that the number of pixels and gradations is limited because the power consumption and price of the system overall must be limited.

The voltages used in the circuit blocks on the display device substrate 101 are different, and there is therefore a problem in that it is necessary to jointly use processes that are suited to a plurality of voltages, and costs in the manufacturing process increase.

The drive circuit-integrated liquid crystal display devices also have a problem in that the size of the display device cannot be reduced because the controller IC and interface circuit 114 are mounted outside the display device substrate.

In view of the above, the present inventors have filed a patent application (Japanese Patent Application (Tokugan) 2004-272638) for an invention that claims a structure and a drive method for the structure that advances the integration of circuits on a carrier substrate and integrates the memory on the carrier substrate. In a circuit in which MOS (Metal Oxide Semiconductor) transistors with a polysilicon TFT or another SOI (Silicon on Insulator) structure is integrated, the technology allows operation malfunctions due to hysteresis to be limited and the sensitivity of latch circuits and latch sense amp circuits that have these MOS transistors as constituent components to be improved.

In this manner, the prior application achieves the initial objects, but in a structure in which memory is integrated on the carrier substrate, it is difficult to reduce the parasitic capacitance of the bit lines. Therefore, there is a limit to reducing the capacitance of the memory cells and it is difficult to reduce the circuit surface area of the frame memory. As a result, it is difficult to reduce the size of display devices that use the frame memory.

Also, this technology requires a considerable amount of electric current for charging and discharging because the capacitance of the memory cells is high. Electric potential is reduced due to wiring resistance because the circuit surface area is large, and power consumption is high due to charging and discharging of the parasitic capacitance of the wiring, leading to a limitation to the amount by which power consumption can be reduced.

SUMMARY OF THE INVENTION

An object of the present invention is to provide a display device and an apparatus having the display device, in which size of the display device can be reduced because the controller IC and interface circuit are formed on the same substrate as the display device substrate, the circuit surface area can be made smaller and power consumption can be reduced by decreasing the capacitance of the memory cells, the operational reliability of the memory unit can be increased, and costs can be made lower, in any cases when the display data of all the pixels is sent serially to the liquid crystal module with high-speed transfer and without high-speed transfer for each frame time interval.

The display device of the present invention is a display device in which a data-holding circuit having a capacitance, and a display portion having a plurality of pixel electrodes are formed on a single first carrier substrate, wherein a second carrier substrate disposed opposite the first carrier substrate is placed above the display portion, but the opposing substrate is not present above the area in which the data-holding circuit is disposed. In the present invention, the parasitic capacitance of the data-holding circuit is low because there is no carrier substrate facing the data-holding circuit. As a result, the capacitance of the data-holding circuit can be reduced in the case of a fixed ratio between the parasitic capacitance and the capacitance of the memory cell and the like within the data-holding circuit. Since the capacitance of the data-holding circuit is small, the area required for the layout of the data-holding circuit is also small.

The display device of another aspect of the present invention is a display device in which a data-holding circuit having a capacitance and a display portion having a plurality of pixel electrodes are formed on a single first carrier substrate, wherein a second carrier substrate disposed opposite the first carrier substrate is provided, and an electroconductive film is not present in the area, disposed opposite the data-holding circuit, on the surface of the second carrier substrate that faces the first carrier substrate side. In the present invention, the parasitic capacitance of the data-holding circuit is low because there is no electroconductive film on the carrier substrate disposed opposite the data-holding circuit.

In this display device, a light-blocking film formed by using a nonconductive body may be disposed in the area, disposed opposite the data-holding circuit, on the surface of the second carrier substrate that faces the first carrier substrate. Conventionally, when an optical leakage current is generated, the electric charge stored in the capacitance of the data-holding circuit is reduced by the leakage current generated in the data-holding circuit, and data erasure or the like occurs, but errors caused by light entering the data-holding circuit can be prevented by a nonconductive light-blocking film. Also, since there is no leakage of electric charge due to optical leakage current, power consumption can be considerably reduced because the application of high voltage, short-cycle refreshing, and other operations often used as a countermeasure to leakage are not required. Also, the light-blocking film is a nonconductive body, and the parasitic capacitance of the data-holding circuit is therefore small.

The display device of another aspect of the present invention is a display device in which a data-holding circuit having a capacitance, and a display portion having a plurality of pixel electrodes are formed on a single first carrier substrate, wherein a second carrier substrate disposed opposite the first carrier substrate is provided, and a medium whose dielectric constant and dielectric anisotropy vary in accordance with the frequency is disposed between the second carrier substrate and the area of the first carrier substrate in which the data-holding circuit is disposed.

The medium may be the same material as the display medium of the display portion.

The medium whose dielectric constant and dielectric anisotropy vary in accordance with the frequency is preferably a medium in which the dielectric constant is reduced in association with an increase in frequency.

An electroconductive film may be provided to the area, disposed opposite the data-holding circuit, on the surface of the second carrier substrate that faces the first carrier substrate side.

The data-holding circuit having a capacitance may have a sense amplifier circuit for amplifying and latching the magnitude of the electric potential between two nodes.

The sense amplifier circuit preferably has a first and second latch circuit, and a transmission control portion is provided that allows or disallows signal transmission between one of the two nodes and at least one of the latch circuits of the first and second latch circuits.

The output voltage amplitude of the first latch circuit is preferably lower than the output voltage amplitude of the second latch circuit. In a sense amplifier circuit with such a configuration, the capacitance in the data-holding circuit can be reduced from ordinary levels because the read signal from the data-holding circuit can be amplified in two stages. In other words, the capacitance in the data-holding circuit can be greatly reduced by the effect of reducing the capacitance with the aid of a sense amplifier, and the synergistic effect of reducing the capacitance by reducing the parasitic capacitance. The voltage applied to the capacitance can also be reduced. As a result, power consumption can be considerably cut back. Also, since a sense amplifier that amplifies in two stages is used, the minimum read voltage width can be reduced and stable operation can be achieved even if the characteristics fluctuate or otherwise vary.

The dielectric body of the capacitance of the data-holding circuit and the dielectric body of a storage capacitor provided to the pixel of the display portion are preferably formed with the same film. An increase in the number of processes can thereby be limited.

A drive circuit for driving the display portion may be disposed on the carrier substrate on which the data-holding circuit and the display portion are disposed.

The dielectric body of the capacitance in the data-holding circuit and the dielectric body of a storage capacitor provided to the pixel are preferably formed with the same film as at least one of the gate oxide films of the transistor having the drive circuit. An increase in the number of processes can thereby be considerably limited. A high performance display device with an internally mounted data-holding circuit can thereby be provided at low cost.

The data-holding circuit may be composed of a DRAM in which memory cells can be refreshed only in a read operation.

The retention time of the memory cells in the DRAM is preferably longer than the repetition time of the read operation.

The source and drain of at least one transistor in the data-holding circuit preferably has an LDD structure.

The apparatus of the present invention has the above-described display device, an electroconductive layer is disposed around the periphery of the display device, and the distance between the data-holding circuit and the electroconductive layer around the periphery of the display device is more than 100 times greater than the thickness of the dielectric body in the capacitance of the data-holding circuit. Because of this configuration, the parasitic capacitance between the electroconductive layer and the data-holding circuit is low. The capacitance of the data-holding circuit can thereby be reduced.

The distance between the data-holding circuit and the electroconductive layer around the periphery of the display device is preferably more than 1,000 times greater than the thickness of the dielectric body in the capacitance of the data-holding circuit. Because of this configuration, the parasitic capacitance between the electroconductive layer of the apparatus and the data-holding circuit is low. The capacitance of the data-holding circuit can thereby be reduced. When the capacitance in the data-holding circuit is not reduced, the ratio to the parasitic capacitance is increased, and the effect of the parasitic capacitance is negligible. Highly stable operation can be achieved as a result.

The apparatus of the present invention has the above-described display device, a dielectric layer is disposed between the display device and the inner wall of the apparatus, and the dielectric layer is composed of a low-k material (material with a low dielectric constant). Because of this configuration, the parasitic capacitance between the electroconductive layer of the apparatus and the data-holding circuit can be reduced, and the capacitance of the data-holding circuit can thereby be reduced.

Another apparatus of the present invention has the above-described display device, a dielectric layer is disposed between the display device and the inner wall of the apparatus, and the dielectric layer is composed of air. Because of this configuration, the parasitic capacitance between the electroconductive layer of the apparatus and the data-holding circuit can be reduced, and the capacitance of the data-holding circuit can thereby be reduced. Since the capacitance can be reduced, power consumption required for charging and discharging the capacitance can be considerably reduced as well.

In accordance with the present invention, the capacitance of the data-holding circuit itself can be reduced by decreasing the parasitic capacitance of the data-holding circuit, and the area required for the layout of the circuit can be reduced as a result. The effect of light incident on the circuit is prevented by providing a nonconductive light-blocking film, and there is no leakage of electric charge due to optical leakage current. Therefore, power consumption can be considerably reduced because the application of high voltage, short-cycle refreshing, and other operations often used as a countermeasure to leakage are not required. Also, since ratio of capacitance in the data-holding circuit and the parasitic capacitance between the electroconductive layer of the apparatus and the data-holding circuit is large, there is little effect from the parasitic capacitance between the electroconductive layer of the apparatus and the data-holding circuit, and very stable operation can be achieved. Moreover, an increase in the number of processes can be limited by forming the capacitance of the data-holding circuit with the same film as the gate oxide film of the transistors of the drive circuit that drives the display area.

DESCRIPTION OF THE PREFERRED EMBODIMENTS

Figure 1:
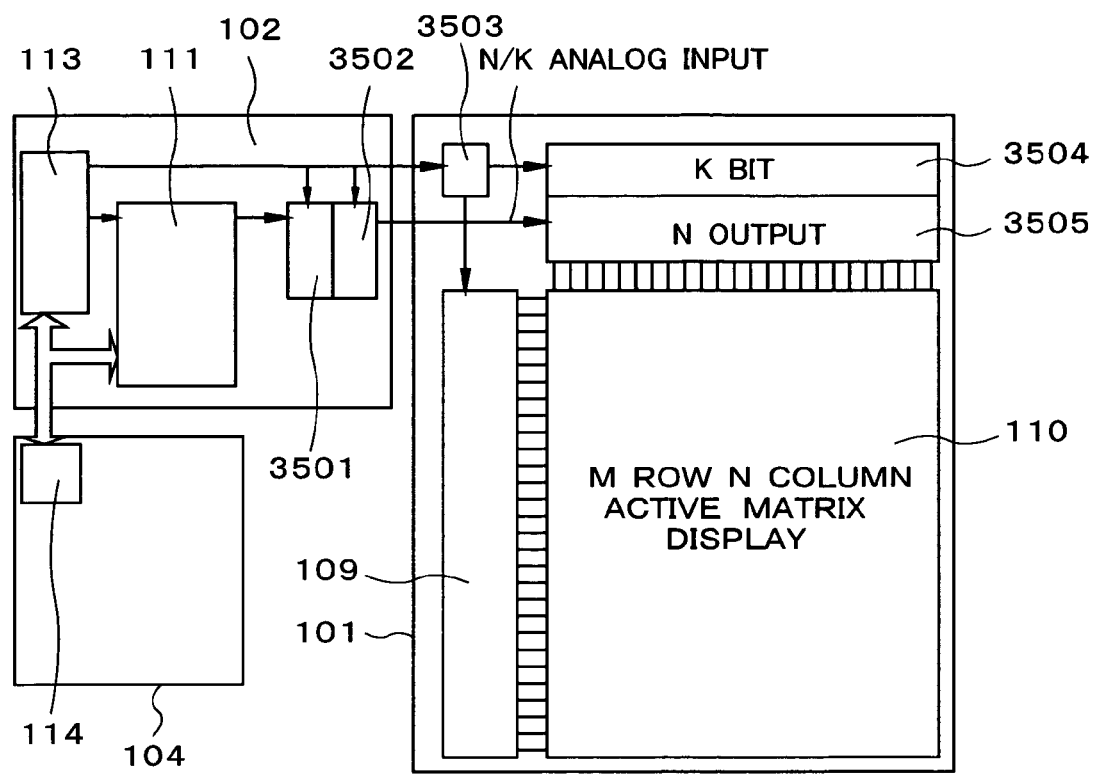
FIG. 1 is a block diagram showing the structure of the display system of the common drive circuit-integrated liquid crystal display device of the prior art.
Figure 2:
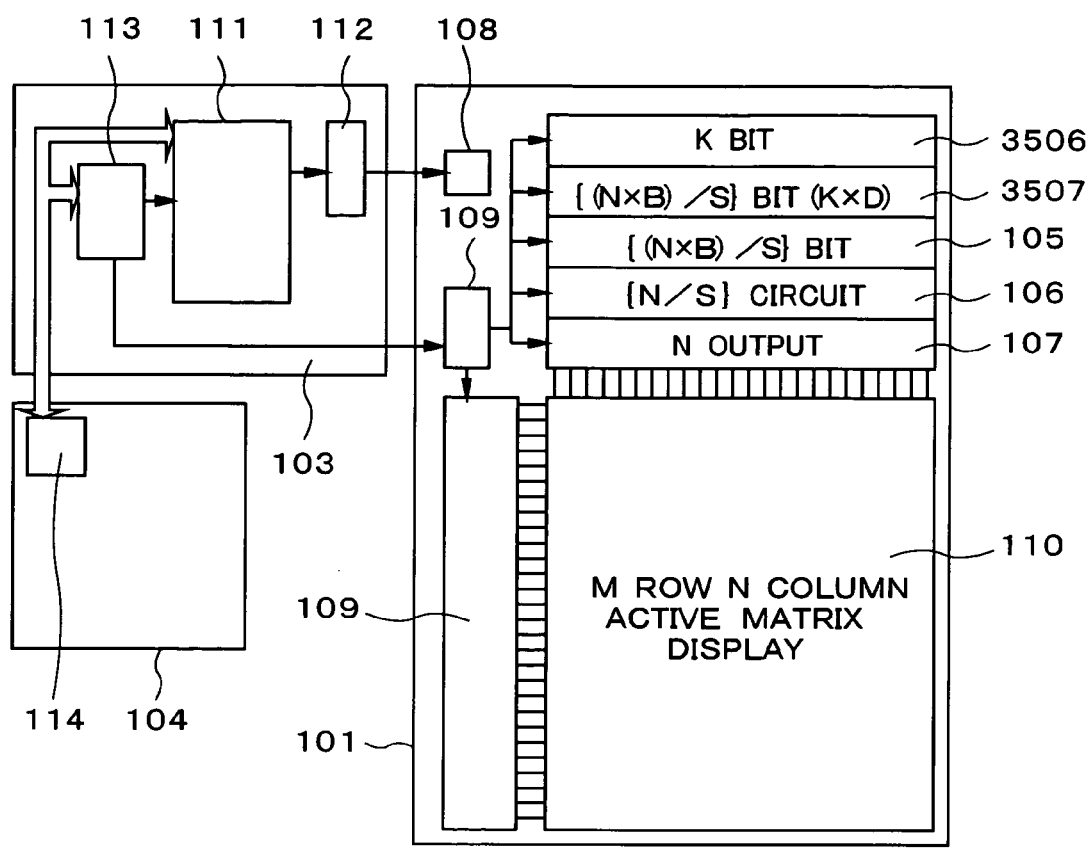
FIG. 2 is a block diagram showing the structure of the display system of a conventional drive circuit-integrated liquid crystal display device with an internally mounted DAC circuit.
Figure 3A:
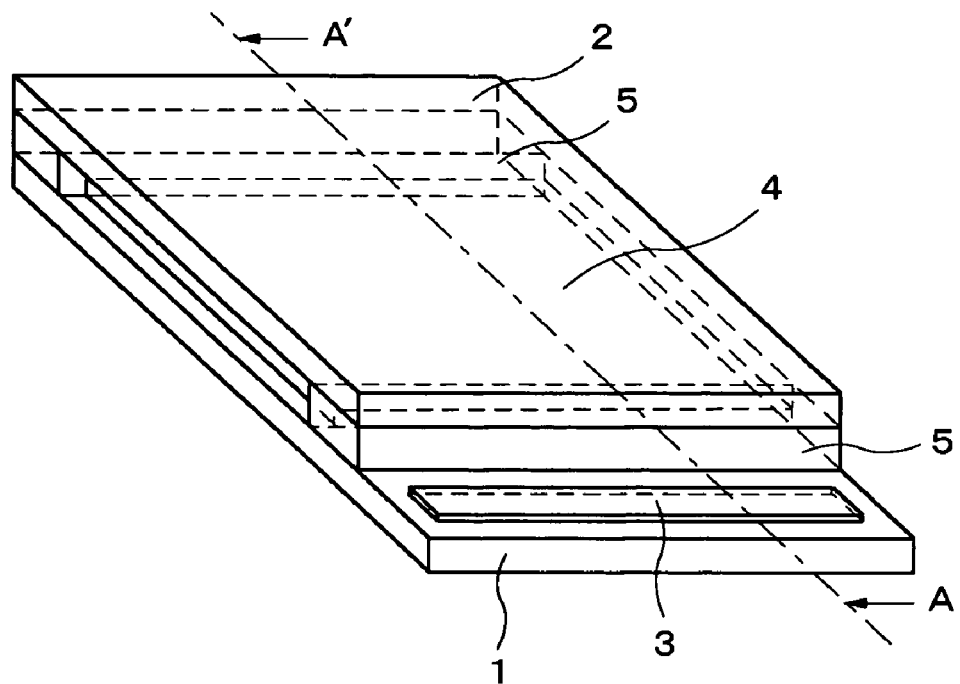
FIG. 3A is a perspective view showing the display device of the first embodiment of the present invention.
Figure 3B:
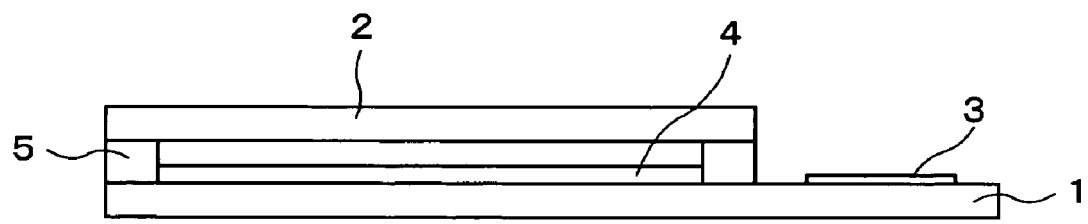
FIG. 3B is a cross-sectional diagram along line A-A' of FIG. 3A.

The embodiments of the present invention are described in detail below with reference to the attached diagrams. FIG. 3A is a perspective view showing the display device of the first embodiment of the present invention, and FIG. 3B is a cross-sectional diagram along line A-A' of FIG. 3A. A display area 4 and a data-holding circuit 3 provided with a capacitance (not shown) are aligned in parallel at regular intervals on a first carrier substrate 1. A spacer 5 is formed with greater thickness than that of the display area 4 along the side nearest to the data-holding circuit 3 of the display area 4 and the side facing thereto without making contact with the data-holding circuit 3 and without being present further outward from the edge portion of the first carrier substrate 1.

A second carrier substrate 2 facing the first carrier substrate 1 is disposed above the display area 4, and a fixed interval is provided by the spacer 5 between the first carrier substrate and the second carrier substrate. However, the opposing substrate is not present above the area in which the data-holding circuit 3 is disposed.

In a display device configured in this manner, parasitic capacitance is not present between the capacitance of the data-holding circuit 3 and the facing carrier substrate because the facing carrier substrate that is connected in series or in parallel with the capacitance of the data-holding circuit 3 is not present. It is for this reason that the parasitic capacitance that accompanies the capacitance of the data-holding circuit 3 is low. As a result, the capacitance of the data-holding circuit 3 can be reduced in the case of a low ratio between the capacitance of the data-holding circuit 3 and the parasitic capacitance that accompanies the data-holding circuit 3 is fixed. Since the capacitance of the data-holding circuit 3 can be reduced, the area required for the layout of the data-holding circuit 3 is small.

Figure 4A:
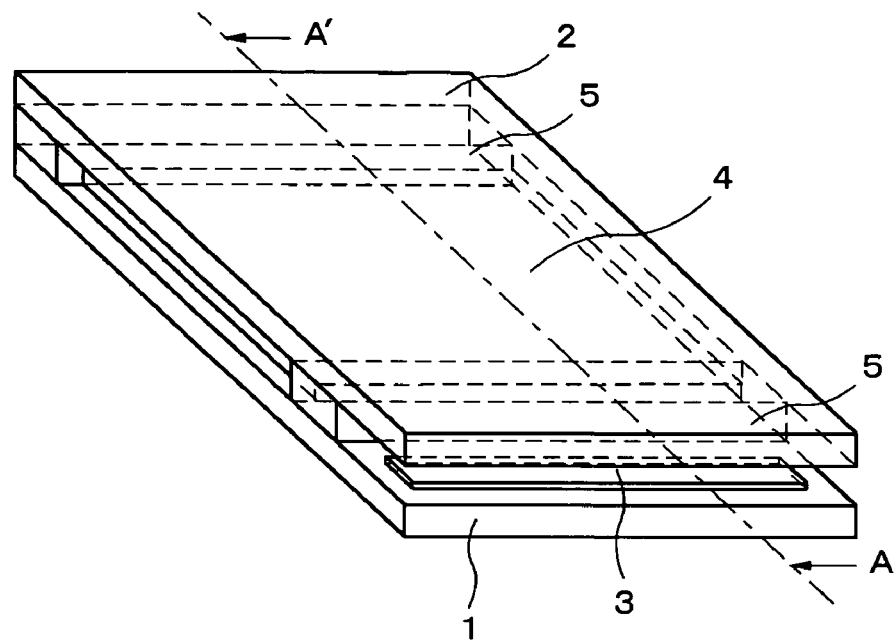
FIG. 4A is a perspective view showing the display device of the second embodiment of the present invention.
Figure 4B:
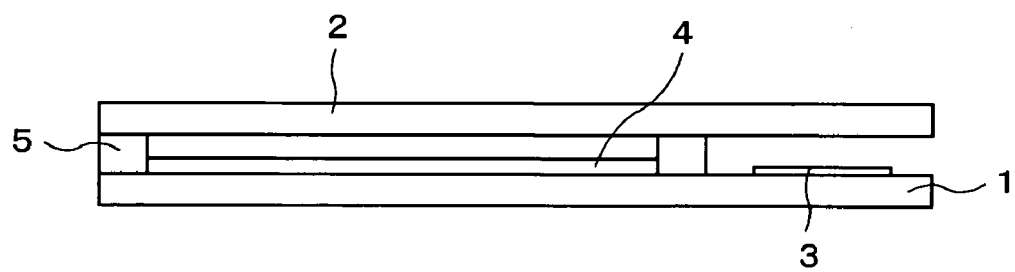
FIG. 4B is a cross-sectional diagram along line A-A' of FIG. 4A.

The second embodiment of the present invention is described next. FIG. 4A is a perspective view showing the display device of the second embodiment of the present invention, and FIG. 4B is a cross-sectional diagram along line A-A' of FIG. 4A. In FIG. 4, the same reference numerals are assigned to the same constituent elements as FIG. 3, and a detailed description thereof is omitted. In the structure of the first embodiment described above, a second carrier substrate 2 disposed opposite the first carrier substrate 1 is placed above the display area 4, and the opposing substrate is not present above the area in which the data-holding circuit 3 is present. In the present invention, however, the second carrier substrate 2 facing the first carrier substrate 1 above the display area 4 is disposed so as to also be present above the data-holding circuit 3, but is otherwise the same structure as the above. Of the portions that intersect with the data-holding circuit 3 of the second carrier substrate 2 in the plan view, an electroconductive film (not shown) may be present on the surface that is on the opposite side from the surface facing the data-holding circuit 3.

In a display device configured in such a manner, parasitic capacitance between the capacitance of the data-holding circuit 3 and the serially or parallelly connected opposite carrier substrate 2 is lower than when an electroconductive film is present in the area, disposed opposite the data-holding circuit 3, on the surface of the second carrier substrate 2 disposed opposite the data-holding circuit 3. It is for this reason that the parasitic capacitance that accompanies the capacitance of the data-holding circuit 3 is low. As a result, the capacitance of the data-holding circuit 3 can be reduced in the case of a fixed ratio between the capacitance of the data-holding circuit 3 and the parasitic capacitance that accompanies the capacitance of the data-holding circuit 3. Since the capacitance of the data-holding circuit 3 can be reduced, the area required for the layout of the data-holding circuit 3 is small.

Figure 5A:
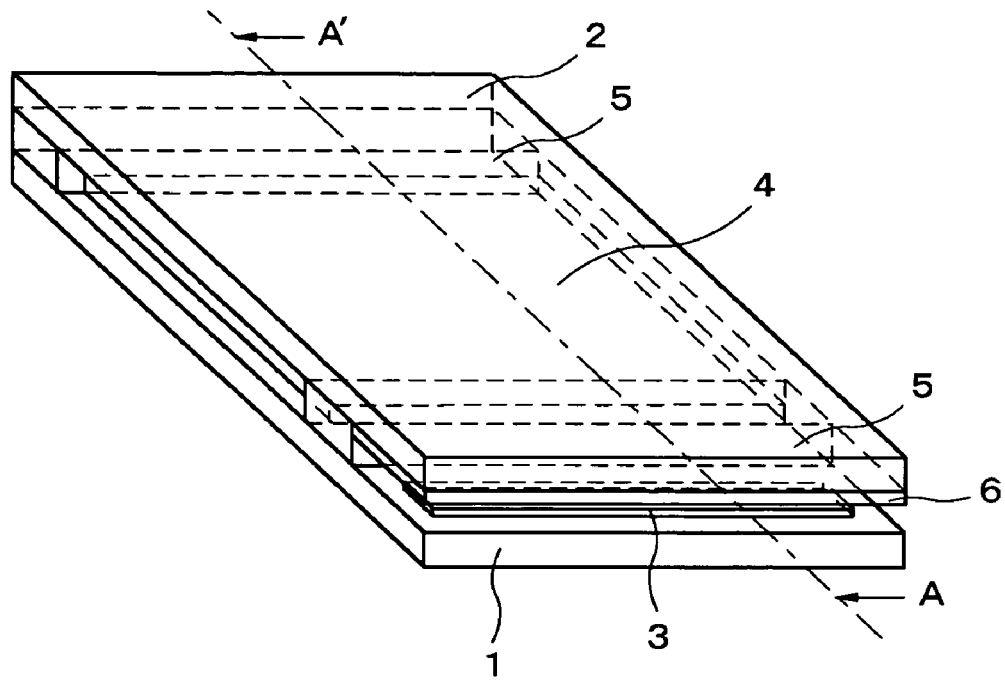
FIG. 5A is a perspective view showing the display device of the third embodiment of the present invention.
Figure 5B:
FIG. 5B is a cross-sectional diagram along line A-A' of FIG. 5A.

The third embodiment of the present invention is described next. FIG. 5A is a perspective view showing the display device of the third embodiment of the present invention, and FIG. 5B is a cross-sectional diagram along line A-A' of FIG. 5A. In FIG. 5, the same reference numerals are assigned to the same constituent elements as FIGS. 3 and 4, and a detailed description thereof is omitted. In the second embodiment described above, a second carrier substrate 2 disposed opposite the first carrier substrate 1 is provided so as to be present above the data-holding circuit 3 as well, but in the present embodiment, the structure is different in that a nonconductive light-blocking film 6 is provided to the area, disposed opposite the data-holding circuit 3, on the surface of the second carrier substrate 2 that faces the data-holding circuit 3. Other aspects of the structure are the same. The light-blocking film 6 can have a function for lessening the intensity of the transmitted light, and the material, film thickness, and other aspects of the film structure are not particularly limited as long as the film is a nonconductive body. The film may perform the light-blocking function by absorbing light that is about to pass through or by reflecting the light.

In a display device configured in such a manner, optical leakage current and other adverse effects are unlikely to occur even if an area of the data-holding circuit 3 is irradiated with light from the side facing the second carrier substrate 2. Also, if for any reason optical leakage current occurs, the magnitude of the leakage current is far less than when a light-blocking film 6 is not present. Since the light-blocking film 6 is formed from a nonconductive body, the parasitic capacitance that accompanies the capacitance of the data-holding circuit 3 is also low. As a result, the capacitance of the data-holding circuit 3 can be reduced in the case of a fixed ratio between the capacitance of the data-holding circuit 3 and the parasitic capacitance that accompanies the capacitance of the data-holding circuit 3. Since the capacitance of the data-holding circuit 3 can be reduced, the area required for the layout of the data-holding circuit 3 is small.

The fourth embodiment of the present invention is described next. In the second embodiment described above, only a data-holding circuit 3, a display area 4, and a spacer 5 are present between the first carrier substrate 1 and second carrier substrate 2, but in the present embodiment, the structure is different in that a medium whose dielectric constant and dielectric anisotropy vary in accordance with the frequency is present between the first carrier substrate 1 and the second carrier substrate 2 in the vicinity of the data holding circuit 3. Other aspects of the structure are the same.

It is particularly preferred that the medium that is present between the first carrier substrate 1 and second carrier substrate 2 in the vicinity of the data-holding circuit 3 have a feature in which the dielectric constant decreases in accordance with the frequency. When the medium has dielectric anisotropy, the medium preferably exhibits considerable variation as the sign of the dielectric anisotropy changes due to the frequency. An example of such a material is a liquid crystal substance that is referred to as a dual-frequency driven liquid crystal or the like.

Figure 6:
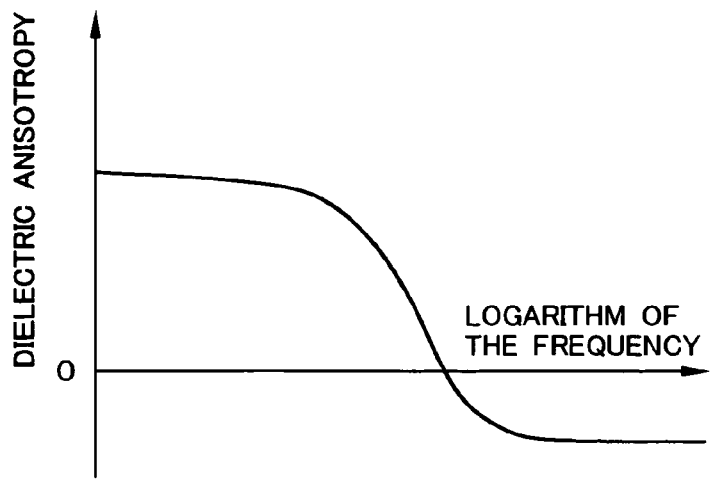
FIG. 6 is a schematic diagram showing the crossover phenomenon of dielectric anisotropy in a dual-frequency driven liquid crystal.

This material has positive dielectric anisotropy under a low frequency, and has negative dielectric anisotropy under a high frequency. In other words, a phenomenon referred to as the "crossover phenomenon" occurs whereby the sign of the dielectric constant is reversed at a certain frequency (referred to as the "crossover frequency"). As a result, the value of the dielectric constant is different under low and high frequencies, and the dielectric constant is lower under high frequency. FIG. 6 shows the relationship between the frequency and the dielectric anisotropy of such a material. The sign of the dielectric anisotropy of such a material varies under high frequency, and the absolute value thereof is ordinarily low in comparison with the value obtained under low frequency.

The crossover frequency is different depending on the material but is generally several MHz (megahertz). For example, when the access signal to the data-holding circuit 3 is 1 MHz or greater, it is in a domain in which the dielectric constant of the medium begins to decrease, an electric field between other wiring on the same substrate is generated by the access signal, and the dielectric constant in the direction of the electric field decreases. It is for this reason that the dielectric constant of the medium on the data-holding circuit 3 is reduced when the data-holding circuit 3 is operating. As a result, the parasitic capacitance that accompanies the capacitance of the data-holding circuit 3 is reduced.

The fifth embodiment of the present invention is described next. In the third embodiment described above, a nonconductive light-blocking film 6 is disposed in the area facing the data-holding circuit 3 on the surface of the second carrier substrate 2 that faces the data-holding circuit 3, and only the data-holding circuit 3, display area 4, spacer 5, and nonconductive light-blocking film 6 are present between the first carrier substrate 1 and second carrier substrate 2. In the present embodiment, however, the structure is different in that, in addition to the above components, a medium in which the dielectric anisotropy and dielectric constant vary in accordance with the frequency is present between the first carrier substrate 1 and second carrier substrate 2 in the vicinity of the data-holding circuit 3, in the same manner as in the fourth embodiment. Other aspects of the structure are the same.

Based on this structure, optical leakage current and other adverse effects are unlikely to occur even if an area of the data-holding circuit 3 is irradiated with light from the side facing the second carrier substrate 2, in the same manner as in the third embodiment described above. Also, if for any reason optical leakage current occurs, the magnitude of the leakage current is far less than when a light-blocking film 6 is not present. Since the light-blocking film 6 is formed from a nonconductive body, the parasitic capacitance that accompanies the capacitance of the data-holding circuit 3 is also low. As a result, the capacitance of the data-holding circuit 3 can be reduced in the case of a fixed ratio between the capacitance of the data-holding circuit 3 and the parasitic capacitance that accompanies the data-holding circuit 3. Since the capacitance of the data-holding circuit 3 can be reduced, the area required for the layout of the data-holding circuit 3 is small.

In the same manner as the fourth embodiment described above, the parasitic capacitance that accompanies the capacitance of the data-holding circuit 3 can be reduced by selecting a dual-frequency driven liquid crystal having a crossover frequency of several megahertz as the medium that is disposed between the first carrier substrate 1 and second carrier substrate 2 in the vicinity of the data-holding circuit 3.

Figure 7A:
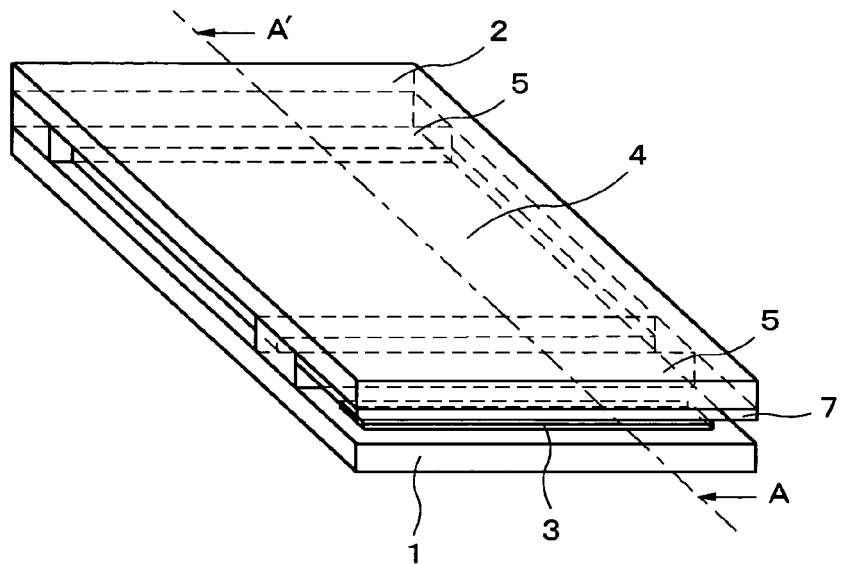
FIG. 7A is a perspective view showing the display device of the sixth embodiment of the present invention.
Figure 7B:
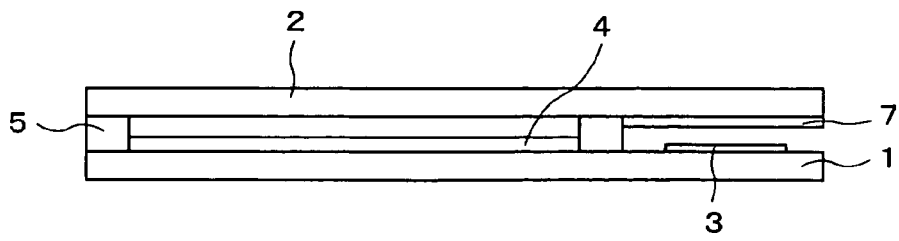
FIG. 7B is a cross-sectional diagram along line A-A' of FIG. 7A.

The sixth embodiment of the present invention is described next. FIG. 7A is a perspective view showing the display device of the sixth embodiment of the present invention, and FIG. 7B is a cross-sectional diagram along line A-A' of FIG. 7A. In FIG. 7, the same reference numerals are assigned to the same constituent elements as FIGS. 3 to 5, and a detailed description thereof is omitted. In the fifth embodiment described above, a nonconductive light-blocking film 6 is disposed in the area facing the data-holding circuit 3 on the surface of the second carrier substrate 2 that faces the data-holding circuit 3. In the present embodiment, however, the structure is different in that an electroconductive film 7 is provided rather than a nonconductive light-blocking film 6. Other aspects of the structure are the same.

In a display device configured in such a manner, when an electric field occurs between the data-holding circuit 3 disposed on the first carrier substrate 1 and the electroconductive film 7 disposed on the second carrier substrate 2, the dielectric constant in the direction of the electric field is reduced by providing a dual-frequency driven liquid crystal having a crossover frequency of several megahertz in cases in which the access signal to the data-holding circuit 3 is 1 MHz or higher, for example. As a result, the parasitic capacitance that accompanies the capacitance of the data-holding circuit 3 can be reduced.

The seventh embodiment of the present invention is described next. A feature of the present embodiment is that the medium used in the fourth to sixth embodiments described above, in which the dielectric constant and dielectric anisotropy vary in accordance with the frequency, is absent between the first carrier substrate 1 and second carrier substrate 2 in the vicinity of the data-holding circuit 3, but is disposed instead between the first carrier substrate 1 and second carrier substrate 2 so as to cover the display area 4, and the medium doubles as the display medium of the display area 4. The dual-frequency driven liquid crystal described above is preferably used as the medium.

The drive frequency of the display area 4 is generally several tens to several hundred hertz, and is within a range in which the dual-frequency driven liquid crystal has a high dielectric constant, the dielectric anisotropy is, for example, positive, and the value of the dielectric anisotropy is high. The access signal of the data-holding circuit 3 is, for example, 1 MHz or higher, as described above, and is in a range in which the dielectric constant of the dual-frequency driven liquid crystal is low. For this reason, the average dielectric constant is kept high by the high dielectric anisotropy in the display area 4 when the display device of the present invention is operating, but the dielectric constant is lower in the vicinity of the data-holding circuit 3. A sufficient response can thereby be made to the display signal because of the high dielectric anisotropy, and the parasitic capacitance that accompanies the capacitance of the data-holding circuit 3 is reduced because of the low dielectric constant in the data-holding circuit 3. As a result, excellent display can be stably obtained by the display device of the present embodiment.

Figure 8A:
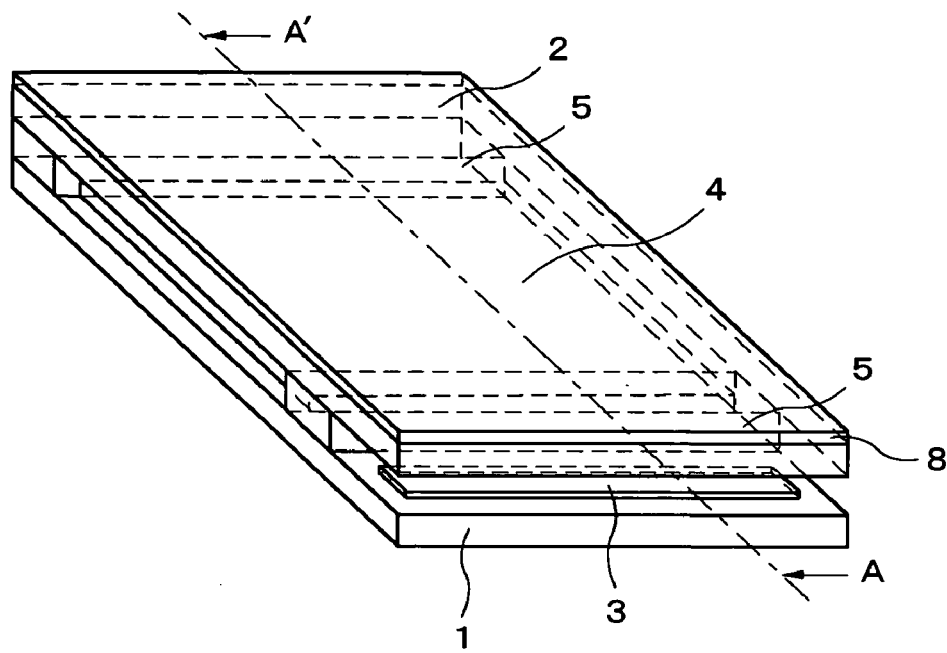
FIG. 8A is a perspective view showing the display device of the eighth embodiment of the present invention.
Figure 8B:
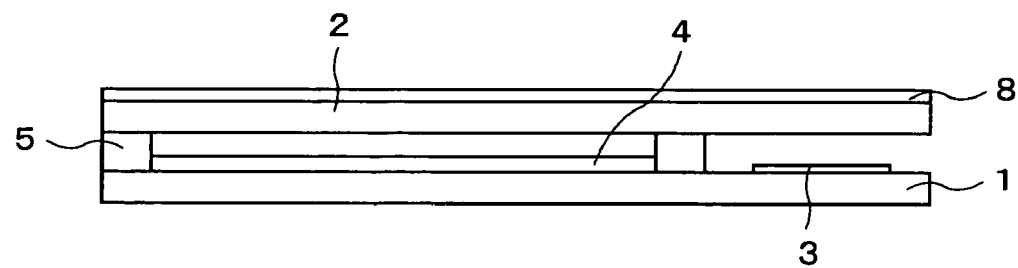
FIG. 8B is a cross-sectional diagram along line A-A' of FIG. 8A.

The eighth embodiment of the present invention is described next. FIG. 8A is a perspective view showing the display device of the eighth embodiment of the present invention, and FIG. 8B is a cross-sectional diagram along line A-A' of FIG. 8A. In FIG. 8, the same reference numerals are assigned to the same constituent elements as FIGS. 3 to 7, and a detailed description thereof is omitted. In the sixth embodiment described above, an electroconductive film 7 is disposed in the area facing the data-holding circuit 3 on the surface of the second carrier substrate 2 that faces the data-holding circuit 3. In the present embodiment, however, the structure is different in that an electroconductive film 8 is not disposed in the area facing the data-holding circuit 3 on the surface of the second carrier substrate 2 that faces the data-holding circuit 3, but is disposed across the entire surface on the side opposite from the surface of the second carrier substrate 2 that faces the first carrier substrate. Other aspects of the structure are the same.

Preferred examples of the electroconductive film 8 disposed in this manner include an electroconductive film that is used in sensor applications for touch panels, and an electroconductive film that is used to prevent the external electric field from affecting the display area in the display mode or the like of the IPS (In-Place-Switching) method.

In the present embodiment, it is possible to keep the parasitic capacitance that accompanies the capacitance of the data-holding circuit 3 low because of the thickness of the second carrier substrate 2, even if an electroconductive film 8 as described above is provided across the entire surface on the side opposite from the surface of the second carrier substrate 2 that faces the first carrier substrate.

Described next is the ninth embodiment of the present invention. In the ninth embodiment of the present invention, the data-holding circuit 3 having the capacitance (not shown) of the display device of the first to eighth embodiments is provided with a sense amplifier circuit that amplifies and latches the magnitude of the electric potential between two nodes. Data stored in the capacitance of the data-holding circuit 3 can easily be read by using the sense amplifier circuit.

Figure 9:
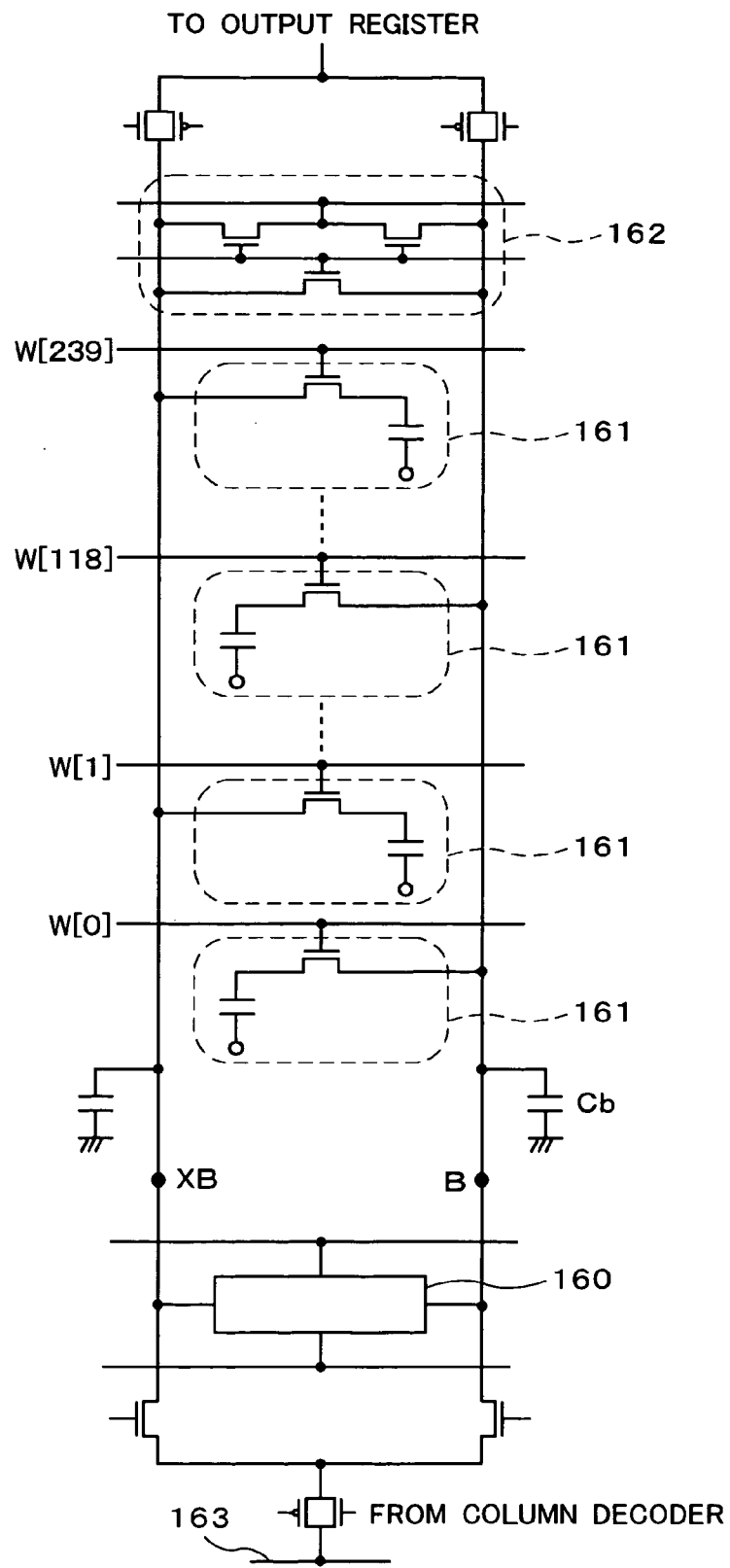
FIG. 9 is a circuit diagram of a single bit line of the sense amplifier-containing memory cell array 121.

FIG. 9 is an example of a circuit diagram of a single bit line of the sense amplifier-containing memory cell array 121. This circuit is composed of a pair of bit lines (XB, B), 240 memory cells 161 connected to two bit lines in an alternating manner, a precharge circuit 162, a sense amplifier circuit 160, and other components. The data of the data line 163 is written in the pair of bit lines (XB, B) that is selected by the signal from a column decoder 122 at the time of data writing. The data written in the pair of bit lines (XB, B) is written in the memory cell 161 of the selected word line ([W 239], W [118], W [1], and W [0] in the illustrated example). Conversely, at the time of data read-out, the data of the selected word line is read to the pair of bit lines (XB, B), is amplified in the sense amplifier circuit 160, and is outputted to the output register side.

When the data-holding circuit (memory cell 161) based on the capacitor is disposed between a pair of bit lines (XB, B) such at that shown in FIG. 9, the following relations can be derived about the parasitic capacitance of the pair of bit lines and the operation of the sense amplifier circuit 160. First, the data held in the capacitance of the data-holding circuit (memory cell 161) during the read operation is read to the pair of bit lines, and the voltage ΔV thus read at this time is given in the following EQ. 1, where $V_{DD}$ is the voltage that is expected to be able amplify the signal, $C_s$ is the capacitance of the data-holding circuit, and $C_b$ is the parasitic capacitance of the pair of bit lines.

$$|\Delta V| = \frac{C_s}{2 \cdot (C_s + C_b)} \cdot V_{DD} \quad \text{[EQ. 1]}$$

When the voltage ΔV read from the pair of bit lines is larger than the sensitivity $S_A$ Of the sense amplifier circuit 160, a bit line circuit such as that shown in FIG. 9 operates normally. In this case, the sensitivity $S_A$ of the sense amplifier 160 is the boundary that determines whether the sense amplifier circuit 160 malfunctions or not, and when expressed as a voltage value, the sensitivity is improved as the value becomes smaller. From this, the relation shown in the following EQ. 2 can be obtained between the capacitance $C_s$ of the data-holding circuit and the parasitic capacitance $C_b$ of the pair of bit lines.

$$C_s > \frac{2 \cdot S_A}{V_{DD} - 2 \cdot S_A} \quad \text{[EQ. 2]}$$

That is, if the parasitic capacitance $C_b$ of the pair of bit lines becomes large, the capacitance $C_s$ of the data-holding circuit must be increased, and if the parasitic capacitance $C_b$ of the pair of bit lines is reduced, the capacitance $C_s$ of a data-holding circuit can be reduced.

Figure 10:
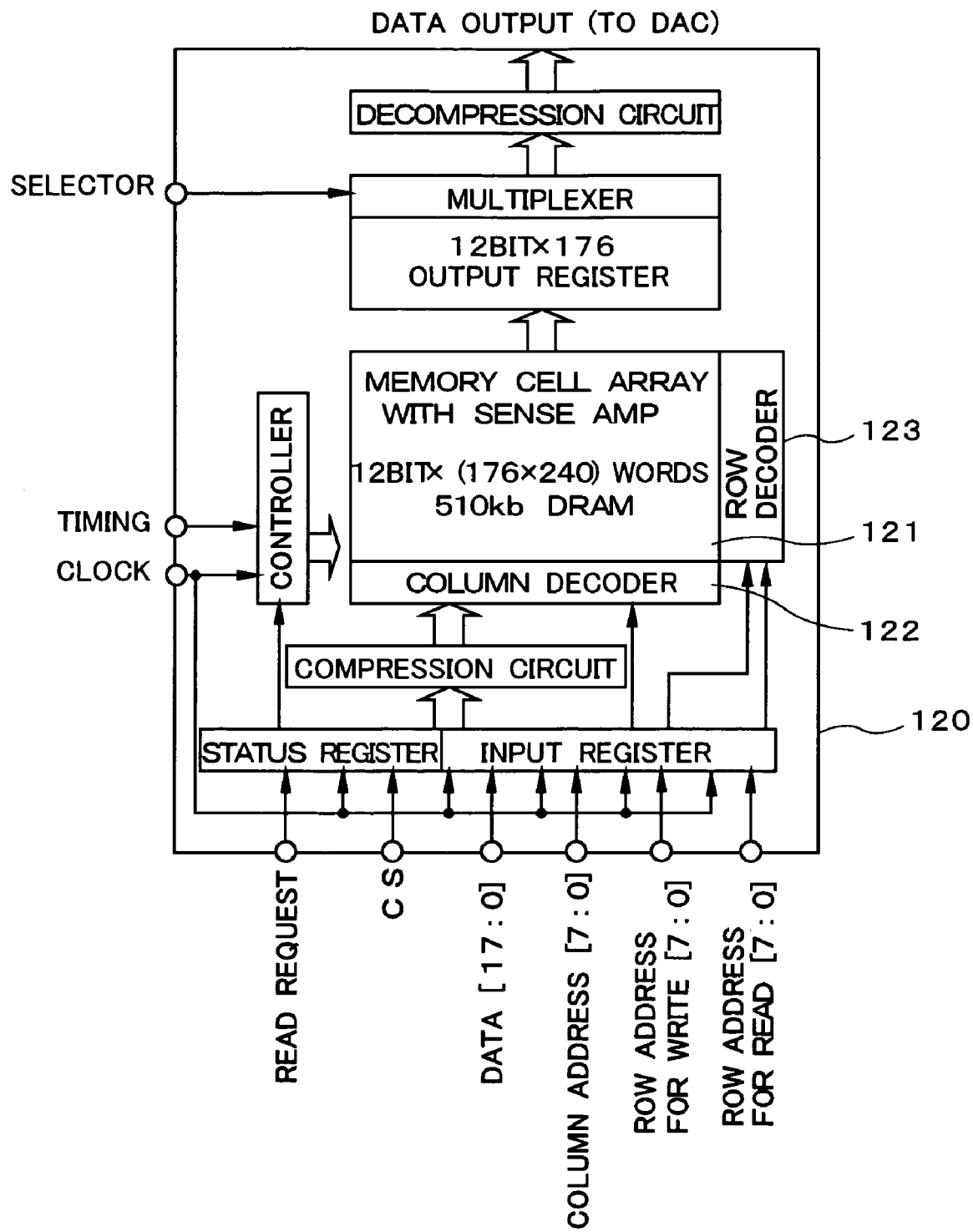
FIG. 10 is a block diagram showing an example of the frame memory structure.

FIG. 10 is a diagram showing the memory configuration. The core portion of a frame memory consists of a memory cell array 121 with a sense amplifier, a column decoder 122, and a row decoder 123. The memory cell array 121 with a sense amplifier can access a specific memory cell by specifying a row address by using the row decoder 123 and a column address by using the column decoder 122. The data signal thus read from the memory cell is output via the sense amplifier. The frame memory circuit described above is formed on a glass substrate 120.

Figure 11:
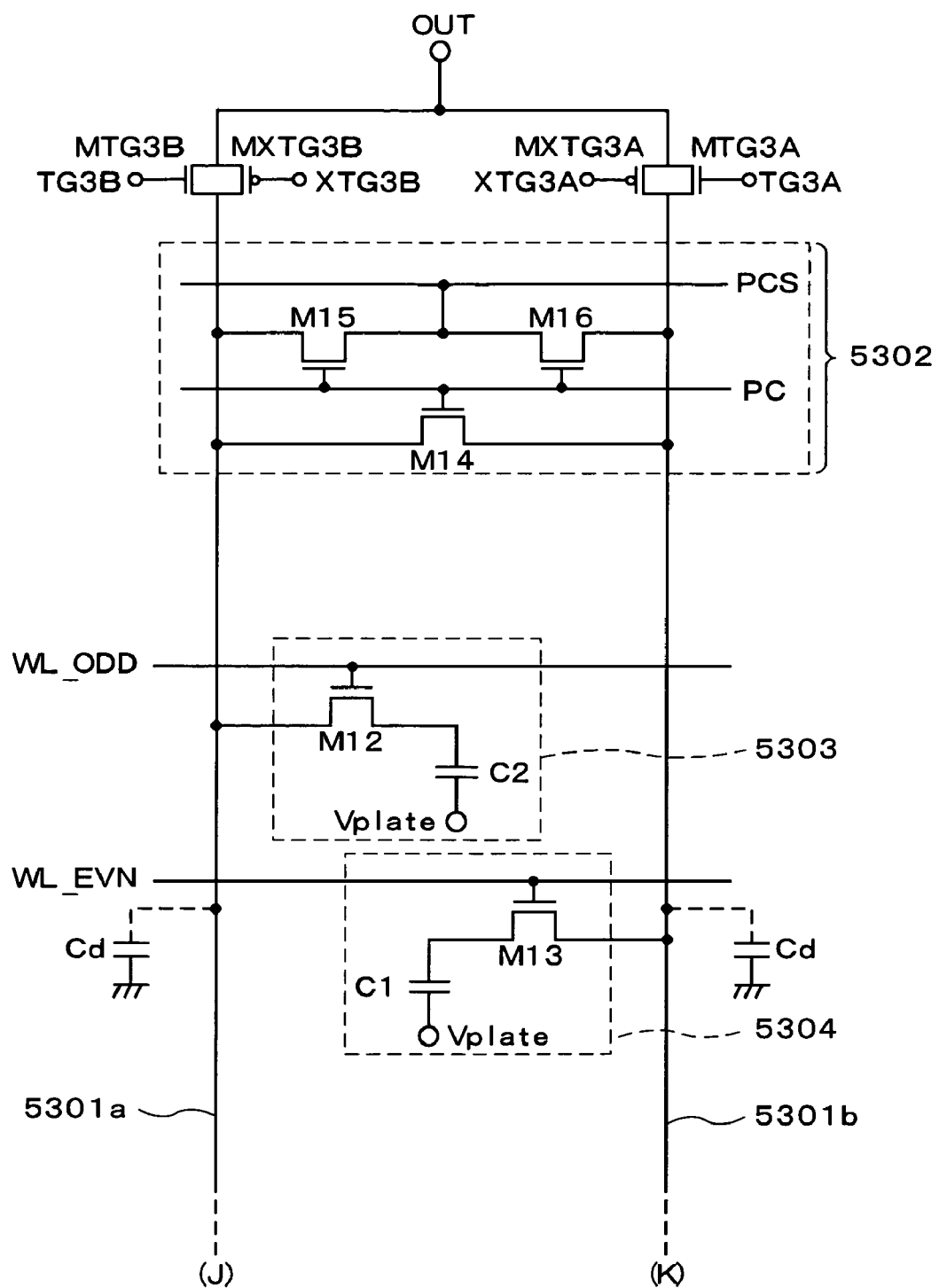
FIG. 11 is a circuit diagram showing the upper portion of a bit line circuit of the display device of the ninth embodiment of the present invention.
Figure 12:
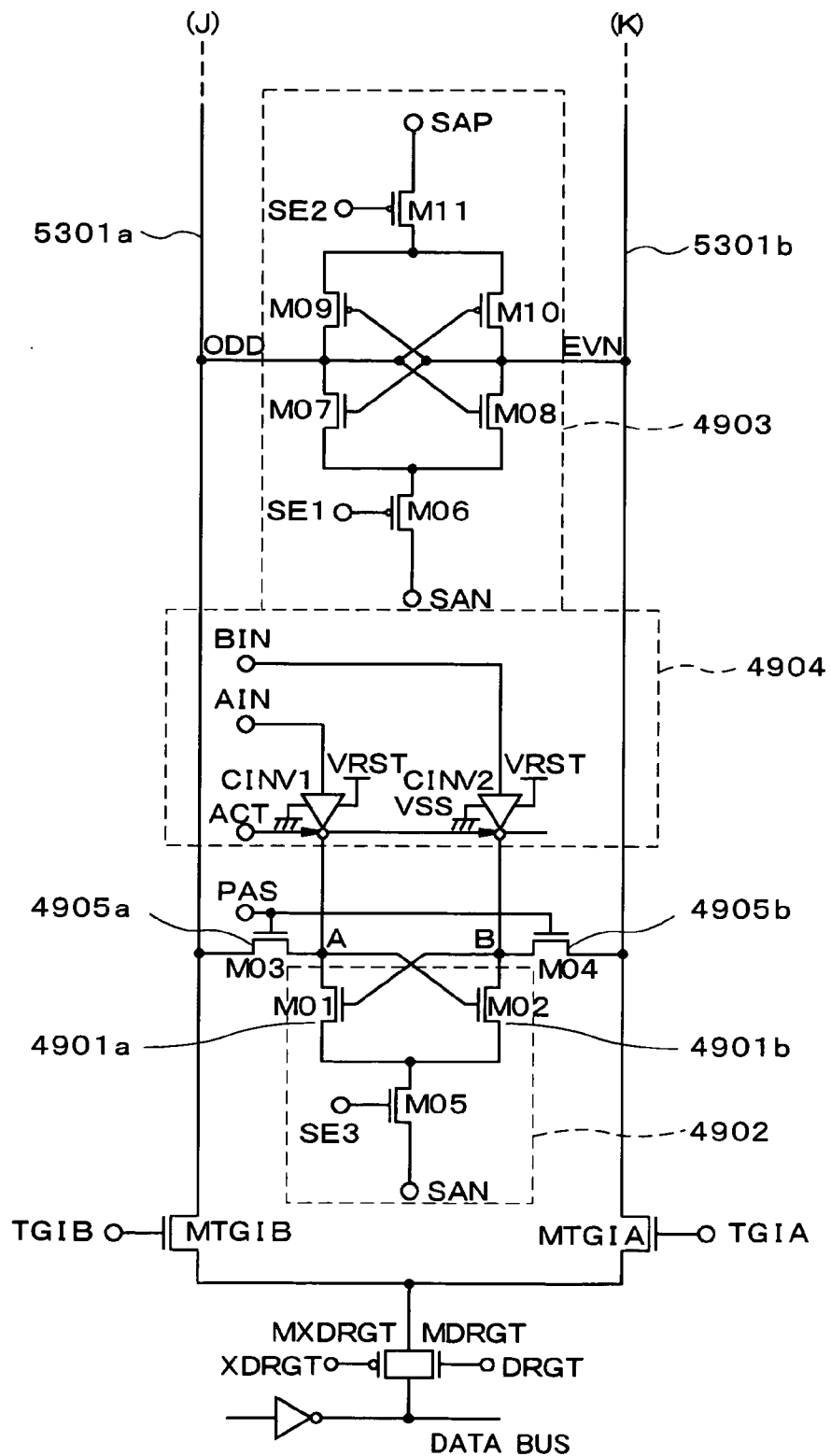
FIG. 12 is a circuit diagram showing the lower portion of a bit line circuit of the display device of the ninth embodiment of the present invention.

Described next is the tenth embodiment of the present invention. FIGS. 11 and 12 are block diagrams showing the structure of the bit line circuit of the present embodiment. For convenience of illustration, the structure is divided into two diagrams, but a single bit line circuit is formed by connecting the points J with each other and the points K with each other, as shown in FIGS. 11 (upper portion of the DRAM circuit diagram) and 12 (lower portion of the DRAM circuit diagram).

In the ninth embodiment described above, the data-holding circuit 3 having a capacitance (not shown) is provided with a single sense amplifier circuit that amplifies and latches the magnitude of the electric potential between two nodes. In the present embodiment, however, the bit line circuit is composed of a sense amplifier circuit having a two stage configuration. More specifically, the sense amplifier circuit is composed of a low-amplitude preamp circuit 4902 that is a first circuit for amplifying the electric potential difference between the nodes to a relatively small amplitude value, and a full-swing amplifier circuit 4903 that is a second circuit for amplifying the electric potential difference obtained by the low-amplitude preamp circuit to the originally required amplitude value.

Switches M03 and M04 are turned off and the low-amplitude preamp circuit 4902 is separated from the bit line before the full-swing amplifier circuit 4903 is operated so that voltage is not applied during full swing to the elements (4901a and 4901b) that form the low-amplitude preamp circuit 4902. Thus, the voltage applied to the element that constitutes the low-amplitude preamp circuit 4902 is kept low because the structure is composed of a low-amplitude preamp circuit 4902 and full-swing amplifier circuit 4903, and a high voltage amplified by the full-swing amplifier circuit 4903, that is to say, the ultimately required output voltage, is driven so as not to be not applied to the low-amplitude preamp circuit 4902.

Furthermore, the sensitivity of the sense amplifier can be improved in the present embodiment because the configuration has a two-stage configuration composed of the low-amplitude preamp circuit 4902 and full-swing amplifier circuit 4903. $S_A$ is ordinarily determined by the sensitivity of the full-swing amplifier circuit 4903. However, the presence of the low-amplitude preamp circuit 4902 in the present embodiment allows sensitivity having a lower value than the sensitivity of the full-swing amplifier circuit 4903 to serve as $S_A$. In other words, it is possible for the value of $S_A$ to become small in EQ. 2 in the present embodiment, and to make the capacitance $C_s$ of a data-holding circuit to be less than that of the ninth embodiment. Thus, the present embodiment is configured so that the parasitic capacitance $C_b$ of the pair of bit lines can be reduced by the effect of the two-stage sense amplifier circuit, and since the capacitance with the second carrier substrate 2 is kept low, the parasitic capacitance that accompanies the capacitance of the data-holding circuit 3 can be reduced.

The eleventh embodiment of the present invention is described next. In the present embodiment, a drive circuit is disposed on the first carrier substrate 1 having a data-holding circuit 3 and display area 4. Also, the dielectric body constituting the capacitance of the data-holding circuit 3 and the dielectric body that forms the storage capacitor of the pixels of the display area 4 are formed with the same film as the gate insulation film of the transistor that forms the drive circuit. There is therefore no need to adopt a special process in order to form the capacitance of the data-holding circuit 3. It is for this reason that the display device of the present invention can be formed with low cost.

The twelfth embodiment of the present invention is described next. The present embodiment uses a DRAM (Dynamic Random Access Memory) in which the memory cells used in the first to eleventh embodiments are used, wherein the cells can be refreshed solely by the operation of reading from the data-holding circuit 3. In order to allow the memory cell to refresh solely by the read operation, a memory cell is used that has a retention time (hold interval, storage interval) that is longer than the repeat interval of the read operation. A double-sided LDD (Lightly Doped Drain) structure is preferably used in a portion of the transistor of the memory cell. Particularly preferred is the use of the double-sided LDD structure in the transistor that is connected to the memory capacitance. The retention time of the memory cell capacitance can thereby be extended.

In accordance with the twelfth embodiment of the present invention, the number of refresh operations can be considerably reduced in contrast to a conventional DRAM. When a single read operation requires 16.7 milliseconds, for example, only one refresh operation can be performed in the 16.7 milliseconds. The power consumption associated with the refresh operation can be considerably reduced and a low power consumption display device can thereby be obtained.

Also, leak current can be considerably limited by using the double-sided LDD structure in which both the source side and drain side of the transistor have LDD structures. The retention time is extended as a result. The structure of the LDD in the double-sided LDD structure may be a simple LDD structure or a GOLD (Gate Overlapped LDD) structure in which the gate electrode overlaps the LDD area.

Figure 13:
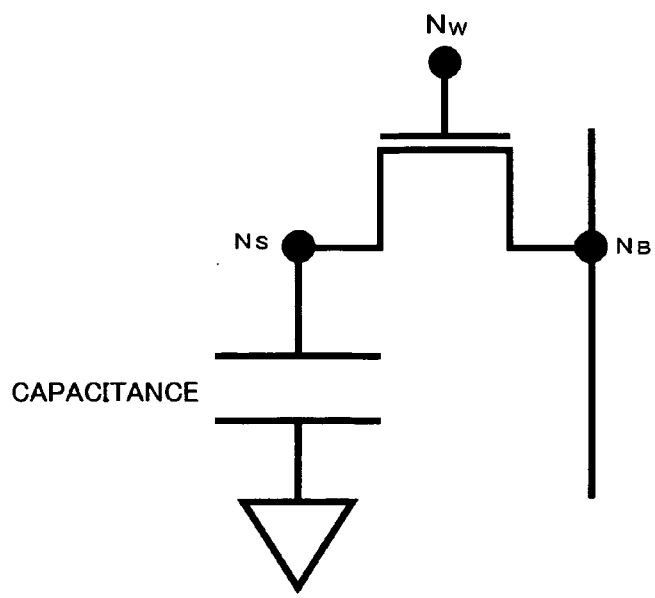
FIG. 13 is a schematic diagram showing the structure of a memory cell with a single transistor/single capacitance structure.
Figure 14:
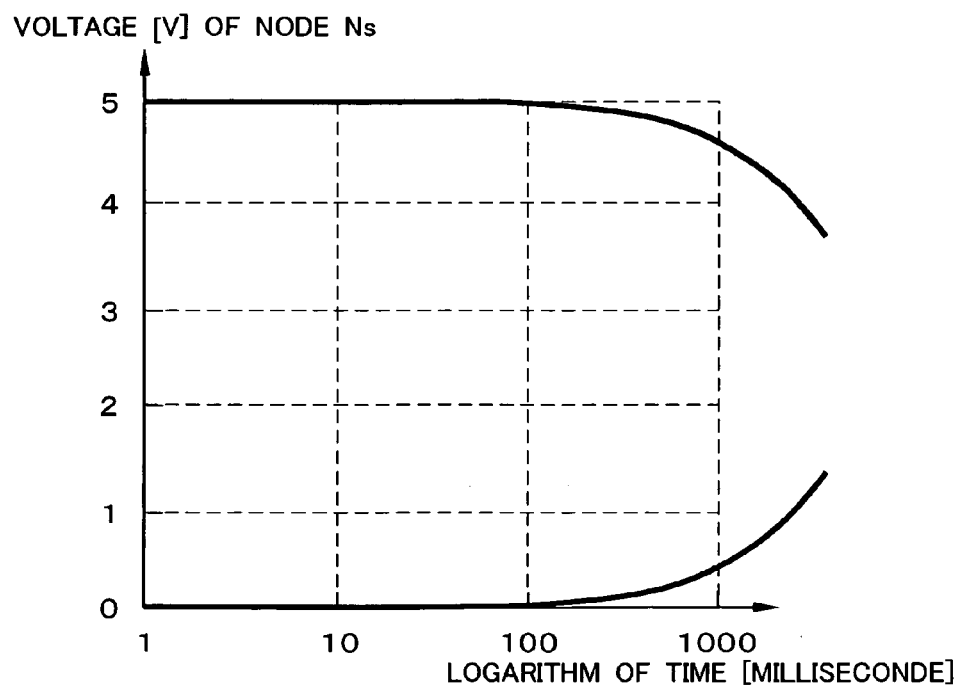
FIG. 14 is the measurement result of the retention time of the capacitance of the memory cell shown in FIG. 13.
Figure 15:
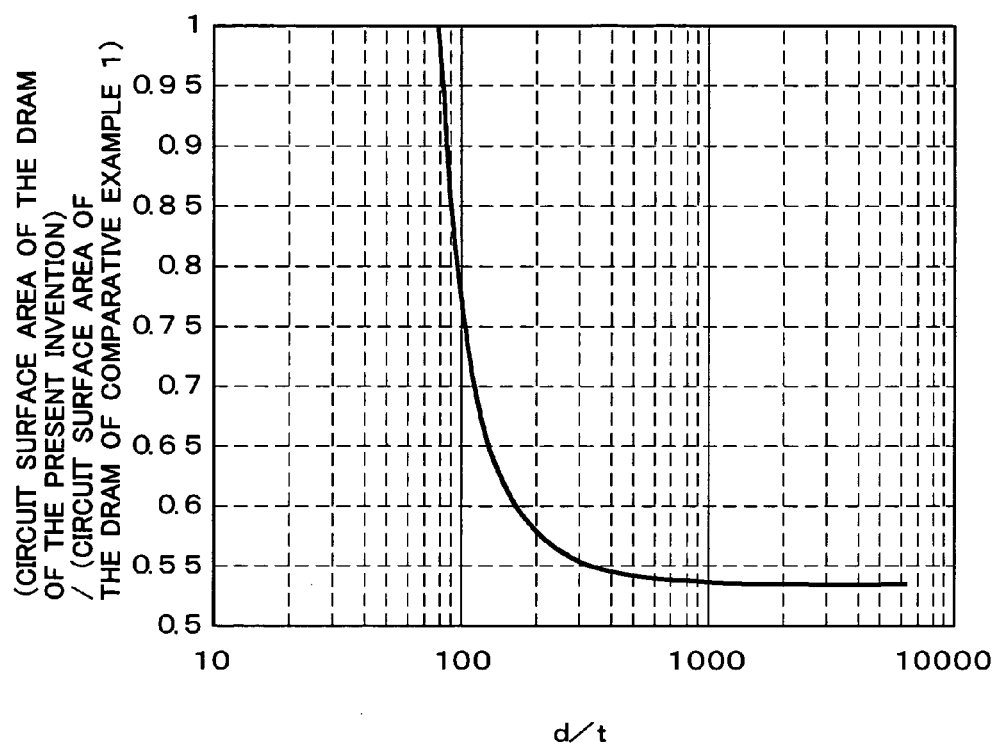
FIG. 15 is a graph showing the expected relationship between the ratio of d to t and the ratio between the circuit surface area of the DRAM portion (data-holding circuit 3) of the first comparative example and the circuit surface area of the DRAM portion (data-holding circuit 3) of the present invention.

FIG. 14 shows an example of the results of measuring the retention time of the capacitance in the memory cell of the present invention, and more particularly a memory cell with a single transistor/single capacitance structure. FIG. 13 is a schematic diagram showing the structure of the memory cell which was used for the measurement. This memory cell is configured with a single transistor and a single capacitance, and a word line is connected to the transistor gate (this node is notated as $N_W$). A bit line is connected to the side that is not connected to the capacitance of the source or drain of the transistor (this node is notated as $N_B$). The symbol $N_S$ is the node between the transistor and the capacitance. Shown in the measurement in FIG. 15 is the variation over time of the voltage of $N_S$ when $N_S=5V$ and $N_B=0V$, and the voltage of $N_S$ when $N_S=0V$ and $N_B=5V$, when $N_W=0V$. It is apparent from FIG. 10 that the retention time in this structure is sufficiently longer than the read operation time of 16.7 milliseconds of an ordinary display. As a result, data can be saved even if a function is provided for refreshing the memory cell solely during the read operation.

The thirteenth embodiment of the present invention is described next. The present embodiment relates to an apparatus in which the display device of the first to twelfth embodiments described above is used. When the display device is used in such an apparatus, an electroconductive layer may be disposed in the apparatus around the periphery of the device. There are also situations in which all or a part of the inside of the apparatus case is metal plated, or a thin copper foil is used as an electromagnetic shield in some areas. In such a situation, the distance between the capacitance of the data-holding circuit 3 and the electroconductive layer on the periphery of the display device of the apparatus is preferably more than 100 times greater than the thickness of the dielectric body of the capacitance of the data-holding circuit 3. The distance is more preferably 1,000 times greater. The parasitic capacitance between the apparatus and the data-holding circuit 3 can thereby be reduced and the circuit surface area can be made smaller.

The fourteenth embodiment of the present invention is described next. The present embodiment relates to an apparatus in which the display device of the first to twelfth embodiments described above is used. In order to fix in place the inner wall and display device of the apparatus or to give buffer strength against shock, a dielectric layer may be provided between the display device and apparatus. In other words, the dielectric layer is an adhesive that fixes the display device and apparatus in place, or is a cushioning material between the display device and the inner wall of the apparatus. In this case, a low-k material is used in the above-described dielectric layer. A low-k material is a material having a low dielectric constant, and the point of reference for a low dielectric constant is ordinarily one that is less than the dielectric constant of a silicon oxide film ($SiO_2$). The dielectric constant of a silicon oxide film is 4.2 in a quartz crystal, and is ordinarily about 3.8 in film formation by plasma CVD (Chemical Vapor Deposition). For this reason, a material whose dielectric constant is less than 4 is generally referred to as a low-k material.

In a display device configured in this manner, the parasitic capacitance between the apparatus and the data-holding circuit 3 can be reduced and the circuit surface area can be made smaller.

The fifteenth embodiment of the present invention is described next. The present embodiment relates to an apparatus in which the display device of the first to twelfth embodiments described above is used. In the present embodiment, the dielectric layer described in the fourteenth embodiment described above is not a low-k material, but is composed of air. The dielectric constant of an air layer is about 1 and is very low.

In a display device configured in this manner, the parasitic capacitance between the apparatus and the data-holding circuit 3 can be reduced and the circuit surface area can be made smaller.

Described next is the first example that shows the effects of the present invention. In the present example, a glass substrate was used as the first carrier substrate 1 of the display device of the third embodiment of the present invention, and the display area 4 and data-holding circuit 3 were fabricated using a TFT array composed of polysilicon (polycrystalline silicon, poly-Si).

More specifically, a silicon oxide film was formed on a glass substrate as the first carrier substrate 1, after which amorphous silicon was grown. Next, an excimer laser was used to anneal the amorphous silicon and form polysilicon, and a 100-Å (10 nm) silicon oxide film was grown.

A silicon film formed according to the above-mentioned process on the glass substrate was patterned with a desired shape, after which a photoresist was patterned, and the source and drain areas were formed by doping with phosphorus ions. A silicon oxide film having a thickness of 900 Å (90 nm) was grown, and microcrystal silicon (μ-c-Si) and tungsten silicide (WSi) were thereafter grown and patterned in the form of a gate.

A silicon oxide film and silicon nitride film were consecutively grown, connector holes were thereafter formed, an aluminum film and titanium film were formed by sputtering and the product was patterned. A silicon nitride film was formed, connector holes were thereafter formed, and ITO (Indium tin Oxide), which is a transparent electrode, was formed as a pixel electrode and patterned. A planar TFT pixel switch was formed in this manner and a TFT array was formed.

The peripheral circuit portion was provided with an n-channel TFT in the same manner as in the pixel switch formation method described above, and a p-channel TFT in which the p-channel was formed by ion doping by substantially the same method as the n-channel TFT.

The data-holding circuit 3 was a DRAM formed with a TFT, and a single memory cell was formed with a single transistor and a single capacitance. The memory cell was connected to a bit line and a word line. A memory cell array composed of a memory cell and a pair of bit lines was formed by alternately arranging such memory cells between two bit lines.

A 4-μm patterned column was formed along the side nearest to the data-holding circuit 3 of the display area 4 on the TFT substrate formed in the above-described step and along the opposing side thereof, and the column was designed to have shock resistance while simultaneously acting as a spacer 5 for maintaining a cell gap.

In the second carrier substrate 2, an ITO surface was patterned in the area disposed opposite a display area (pixel area) 4 when set to face the TFT substrate, a light-blocking film 6 was provided in the form of a nonconductive light-absorbing resin in the area disposed opposite the DRAM portion (data-holding circuit 3), and a UV-curing sealing material was applied in the other areas on the same surface.

Liquid crystal was fed dropwise through a dispenser in the display area 4 of the TFT substrate, the TFT substrate and second carrier substrate 2 were brought together, and the sealing portion was irradiated with UV rays to perform bonding. A nematic liquid crystal was used as the liquid crystal material, and a TN-type configuration was formed by adding a chiral material and matching the rubbing direction.

In the present example, an excimer laser was used to form a polysilicon film, but it is also possible to use, for example, a continuously oscillating CW (Continuous Wave Oscillation) laser or another laser.

Described next is a second example that shows the effects of the present invention. In the present example, a glass substrate was used as the first carrier substrate 1 of the display device of the first embodiment of the present invention in the same manner as in the first example, and a display area 4 and data-holding circuit 3 were fabricated with a TFT array composed of polysilicon (polycrystalline, poly-Si).

The present embodiment involves a structure in which a second carrier substrate 2 is not present above the DRAM portion (data-holding circuit 3). When the second carrier substrate 2 was set so as to face the TFT substrate, an ITO surface was patterned in the area facing the display are 4, and a 4-μm resin spacer was formed in the area disposed opposite the peripheral portion of the display area 4 of this surface.

A thermosetting sealing material was applied to the external periphery of the display area 4 of the TFT substrate formed by the same step as in example 1.

The TFT substrate and second carrier substrate 2 were bonded by applying heat, after which liquid crystal was injected into the gap provided by the resin spacer 5. A nematic liquid crystal was used as the liquid crystal, and a TN-type configuration was formed by adding a chiral material and matching the rubbing direction.

To draw a comparison with example 2 described above, a display device was fabricated with a second carrier substrate having ITO in the area disposed opposite the DRAM portion (data-holding circuit 3) of the TFT substrate. The resulting structure is comparative example 1. In example 2 of the present invention and comparative example 1, the capacitance of the data-holding circuit 3 is optimized for each case.

Comparing example 2 of the present invention and comparative example 1, the parasitic capacitance per 1 micron of a bit line is reduced by 0.25 fF, that is, 16% in example 2, in contrast to 0.30 fF in comparative example 1. Because of this effect, the layout length W of the memory cell array portion drops to 2.3 mm in example 2, in contrast to 4.4 mm in comparative example 1. The reduction ratio exceeds 47%.

The reason that the layout length of the memory cell array differs more greatly than the difference in parasitic capacitance is that the required memory cell capacitance is considerable when the parasitic capacitance is large, the length of the bit lines is extended, the overall parasitic capacitance of the bit lines increases when the length of the bit lines is extended, and the required memory cell capacitance increases. Therefore, the layout length of the memory cell array portion is determined by making the memory cell capacitance, the bit line length, and the parasitic capacitance per 1 micron of bit line into parameters in the design and optimizing the parameters. As described above, a considerable difference in the layout length of the memory cell array portion is created between example 2 and comparative example 1 as a result of such optimization.

Described next is the third example of the present invention. In example 1 described above, a film was not provided to the surface on the side opposite from the surface of the second carrier substrate 2 that faces the TFT substrate. In the present example, however, the structure is different in that an electroconductive film 8 is provided to the surface on the side opposite from the surface of the second carrier substrate 2 that faces the TFT substrate. Other aspects of the structure are the same. Even with such a configuration, a circuit surface area that is less than in the comparative example 1 described above was obtained in the display device of the present example.

FIG. 15 shows the expected relationship between the ratio of d to t and the ratio between the circuit surface area of the DRAM portion (data-holding circuit 3) of the comparative example 1 and the circuit surface area of the DRAM portion (data-holding circuit 3) of the present invention, wherein d is the distance between the DRAM portion (data-holding circuit 3) and the electroconductive film 7 or 8 (regardless of whether it is disposed on the surface facing the data-holding circuit 3 or on the surface opposite from the side facing the data-holding circuit 3) disposed on the second carrier substrate 2, and t is the thickness of the dielectric layer of the capacitance of the DRAM portion (data-holding circuit 3).

It is apparent from FIG. 15 that the circuit surface area of the DRAM portion (data-holding circuit 3) can be reduced as the distance d increases between the DRAM portion (data-holding circuit 3) and the electroconductive film 7 or 8 disposed on the second carrier substrate 2, in comparison with the thickness t of the dielectric film of the capacitance of the DRAM portion (data-holding circuit 3). In particular, when the ratio t:d exceeds 1:100, the circuit surface area of the DRAM portion (data-holding circuit 3) can be reduced to ¾ or less of that of comparative example 1, and when the ratio t:d exceeds 1:1000, the circuit surface area reduction essentially reaches a limit, and a configuration with the smallest circuit surface area is made possible.

More specifically, when the thickness of the dielectric film of the capacitance of the DRAM portion (data-holding circuit 3) is 200 nm, for example, the smallest circuit surface area can be achieved by setting the distance from the electroconductive film 7 or 8 of the second carrier substrate 2 to be 200 μm or greater. Also, when the thickness of the dielectric film of the capacitance of the DRAM portion (data-holding circuit 3) is 50 nm, the smallest circuit surface area can be achieved by setting the distance from the electroconductive film 7 or 8 of the second carrier substrate 2 to be 50 μm or greater.

In the case that a thin substrate is used as the second carrier substrate 2, and the substrate thickness is, for example, less than 50 μm, the thickness of the dielectric film of the capacitance of the DRAM portion (data-holding circuit 3) can be made less than 50 nm when the goal is to obtain the minimal circuit surface area. Such a thin substrate can be obtained by abrasion or other treatment that involves polishing, treatment with hydrofluoric acid or another chemical liquid, or laser abrasion of the glass substrate. Also, a plastic substrate may be used.

In the converse case that the thickness of the dielectric film of the capacitance of the DRAM portion (data-holding circuit 3) is 200 nm, for example, a space that is 200 μm or greater is provided between the DRAM portion (data-holding circuit 3) and the physical structure of the apparatus when the display device of the present invention is disposed within the apparatus, and the smallest circuit surface area can be achieved by disposing no electroconductive body in this space.

Described next is the fourth example of the present invention. In the present example, the ninth embodiment is implemented in which a sense amplifier with a two-stage configuration is used on the basis of the first embodiment of the present invention. The method of forming a TFT substrate is the same as the method described above in example 1. In particular, the circuit configuration and operation of the DRAM portion (data-holding circuit 3) are described below.

The configuration of the bit line circuit of the present example is described with reference to FIGS. 11 and 12. For convenience of illustration, the structure is divided into two diagrams, but a single bit line circuit is formed by connecting the points J with each other and the points K with each other, as shown in FIGS. 11 (upper portion of the DRAM circuit diagram) and 12 (lower portion of the DRAM circuit diagram).

The first circuit; that is, the low-amplitude preamp circuit 4902, and the second circuit; that is, the full-swing amplifier circuit 4903, are connected to the pair of bit lines 5301a, 5301b. The selected memory cell is connected to the bit line ODD (5301a) when the word address is an odd number. Shown in the diagram as an example is the case in which a memory cell 5303 composed of an N-channel MOS (Metal Oxide Semiconductor) transistor M12 and a capacitance C2 is selected by the word line WL_ODD. Connected in a similar fashion is a memory cell selected by the bit line EVN (5301b) when the word address is an even number. Shown in the diagram as an example is a case in which a memory cell 5304 composed of an N-channel MOS transistor M13 and a capacitance C1 is selected by the word line WL_EVN. The plurality of other memory cells are omitted.

A precharge circuit 5302 composed of N-channel MOS transistors M14 to M16 is connected to the pair of bit lines, and the MOS transistors are switched on or off with a signal applied to the PC node. When $V_{DD1}/2$ is applied to the PCS and the control line PC is set to a high level, the pair of bit lines is set to $V_{DD1}/2$.

A transfer gate consisting of MTG3A and MXTG3A for reading data is connected to the bit line EVN, and the transfer gate is switched on or off by the control lines TG3A and XTG3A (a signal with a complimentary relationship with TG3A is applied). Also, the transfer gate consisting of MTG3B and MXTG3B is connected to the bit line ODD, and the transfer gate is turned on or off by control lines TG3B and XTG3B. The two transfer gates are activated when data is read to an OUT node. One of the transfer gates is switched on in accordance with whether the word address of the memory cell to be read is an odd number or an even number.

An analog switch MTG1A is connected to the bit line EVN for data writing, and this analog switch is switched on or off by the control line TG1A. An analog switch MTG1B is connected to the bit line ODD, and this analog switch is switched on or off by the control line TG1B. These two analog switches are activated when data is to be written. Only one of the analog switches is switched on in accordance with whether the word address of the memory cell to be written is an even or odd number.

The transfer gate consisting of MDRGT and MXDRGT is switched on or off by a column decoder (not shown). DRGT is switched on during a write operation and in a case in which the column address corresponds to the bit line circuit of this address. A data bus signal is transmitted to switches MTG1A and MTG1B and is written to the bit line by way of one of the switches.

The power supply voltage in the present example is $V_{DD1}$. Also, the SAN nodes of the low-amplitude preamp circuit 4902 and the full-swing amplifier circuit 4903 are connected to $V_{SS}$ (=0 V). The SAP node is connected to $V_{DD1}$. The terminal $V_{plate}$ on the side not connected to the MOS transistor of the capacitance in the memory cells 5303 and 5304 is connected to the $V_{DD1}/2$, and the voltage stress between the capacitance terminals is minimized. In FIG. 14, $C_d$ indicates the parasitic capacitance of each bit line.

Figure 16:
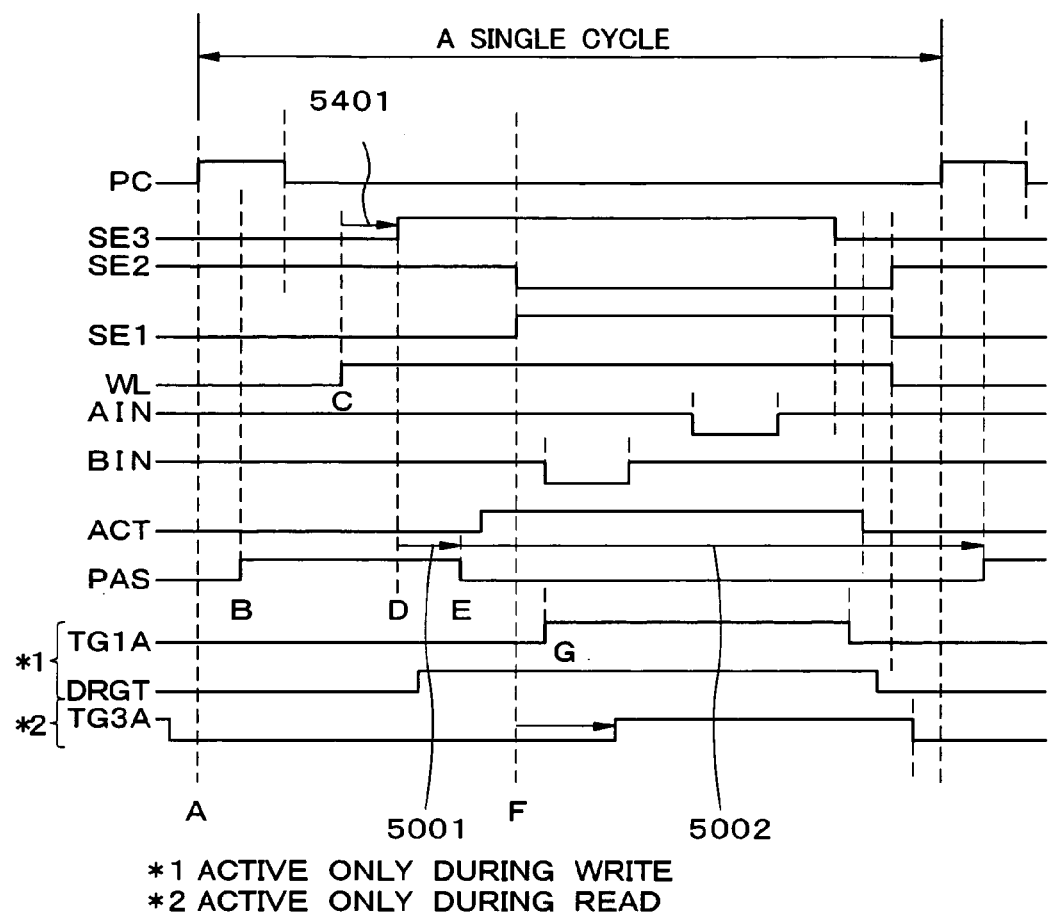
FIG. 16 is a block diagram showing the operation of a DRAM circuit of the display device of the fourth example of the present invention.

The operation of the DRAM circuit of the present example is described next with reference to FIG. 16. Described first is the operation in the case in which data is read to the OUT node from the memory cells 5303 and 5304.

The pair of bit lines (ODD, EVN) are pre-charged to $V_{DD1}/2$ by the precharge circuit 5302 when the PC is started up at time A. A high level is applied to PAS at time B, at which the pair of bit lines has been pre-charged, and the switches M03 and M04 are switched on. The nodes A and B are thereafter pre-charged to $V_{DD1}/2$.

A high voltage is then applied to a single word line at time C. In this example, the high voltage is applied to WL_EVN. The ΔV voltage is thereby read to the bit line EVN by using the voltage held by C1 of the memory cell 5304. When the voltage held by C1 is $V_{DD}$, the voltage that appears at the bit line EVN is $V_{DD1}/2+|\Delta V|$, and when the voltage held by C1 is 0, the voltage that appears is $V_{DD1}/2-|\Delta V|$. The value of |ΔV| is expressed by EQ. 1 described above.

Described below is the case in which the voltage held by C1 of the memory cell 5304 is $V_{DD1}$, and a voltage of $V_{DD1}/2+|\Delta V|$ appears at the bit line EVN when high voltage is applied to WL_EVN.

At time D, the low-amplitude preamp circuit 4902 starts the amplification and latching operation by applying a high level to SE3. Since the voltage of EVN is $V_{DD1}/2+|\Delta V|$ and the voltage of ODD is $V_{DD1}/2$, the voltage of ODD is reduced to $V_{SS}$ (=0 V) by the sensing operation of the low-amplitude preamp circuit 4902. On the other hand, the voltage of EVN is reduced only slightly and is about $(V_{DD1}/2)-\beta$, for example. In this expression, β is the difference between $V_{DD1}/2$ and the voltage at which the higher-voltage node stabilizes.

When the electric potential difference ΔV of EVN and ODD are amplified to the desired electric potential difference by the low-amplitude preamp circuit 4902, and writing to the pair of bit lines (ODD, EVN) is completed, PAS is set to a low level as indicated by E, the switches M03 and M04 are switched off, and the low-amplitude preamp circuit 4902 is separated from the pair of bit lines.

A body potential reset pulse for resetting the body potential of M01 and M02 is then applied to the low-amplitude preamp circuit 4902.

On the other hand, the voltage (0, ($V_{DD1}$/2)-β) amplified by the low-amplitude preamp circuit 4902 and held in the pair of bit lines is amplified to (0, $V_{DD1}$) by the full-swing amplifier circuit 4903 at time F.

The signal amplified to the power supply voltage is read to the OUT node by switching on the transfer gate consisting of MTG3A and the like.

The process up to this point is the operation of a single cycle, and the operation is returned to pre-charging the bit lines when reading or writing is to be carried out again.

Described herein is the operation of reading data to the OUT node, but the memory cells 5303 and 5304 are also simultaneously refreshed at this time. In other words, when the full-swing amplifier circuit 4903 is activated by SE1 and SE2 at time F, a high level is applied to the word line (WL-EVN, in this case). Therefore, the signal of the bit line amplified to the power supply voltage is written unchanged to the memory cell (5304, in this case), and the data of the memory cell is refreshed.

Described next is the operation of writing 0V from the data bus to the capacitance C1 in the memory cell 5304.

The time from A to F and the driving by which the body-potential reset pulse is applied to the low-amplitude preamp circuit 4902 are the same as in the above-described operation for the case in which data is read from the memory cells 5303 and 5304 to the OUT node. Therefore, the process that follows time F is described here.

MTG1A is switched on at time G. The transfer gate consisting of MDRGT and the like is switched on by a column decoder (not shown) at this time, and M13 is switched on by WL_EVN. Therefore, 0V that appears on the data bus can be written in the capacitance C1 through the pass of the bit line EVN (5301b) and the transistor M13. At this point, the full-swing amplifier circuit 4903 is in a latched state, but the impedance of the data bus, the transfer gate composed of MTG1A and the like, and MDRGT is sufficiently low, and the latched state can be inverted to thereby write data.

The process up to this point is the operation of a single cycle, and the operation is returned to pre-charging the bit lines when reading or writing is to be carried out again.

The sensitivity of a latching sense amplifier circuit is increased by resetting the body potential, and a stable read operation can be carried out without malfunction even if the absolute value of the ΔV is low. For this reason, the number of memory cells that can be connected to a pair of bit lines can be increased, and the memory capacity (the amount of information that can be stored in memory, and not the capacitance value of a memory cell) per unit of surface area can be increased.

After power is switched on, the operation of writing to the memory cells is carried out prior to the operation of reading from the memory cells. A body-potential reset pulse is applied to the MOS transistor 4901a and 4901b of the low-amplitude preamp circuit 4902 during the write operation, and malfunctions in a latching sense amplifier can therefore be avoided even it is the first read operation after power is switched on.

Since the sense amplifier has a two-stage configuration, the sensitivity of the entire latching sense amplifier circuit is improved, and stable read operations can be carried out even when the absolute value of the ΔV is low. For this reason, the number of memory cells that can be connected to a pair of bit lines can be increased, and the memory capacity per unit of surface area can be increased as well.

Furthermore, since parasitic capacitance is not present between the second carrier substrate 2 and the capacitances thereof, the parasitic capacitance that accompanies the capacitance of the DRAM portion (data-holding circuit 3) can be considerably reduced. As a result, the size of the capacitance within the memory cell can be reduced and the number of memory cells that can be connected to a pair of bit lines can be increased. Hence, the memory capacity per unit of surface area can be increased.

In the examples described above, a DRAM is used as the data-holding circuit 3 in order to facilitate the description of the present invention, but the data-holding circuit may be one that uses another type of capacitance. Also, the structure of the capacitance may be one that has two electrodes in the direction vertical to the substrate surface, or may be one that has two electrodes in the direction horizontal to the substrate surface.

What is claimed is:

1. An apparatus, comprising:
    a display device comprising
        a data-holding circuit having a capacitance;
        a display portion having a plurality of pixel electrodes;
        a first carrier substrate on which the data-holding circuit and the display portion are formed; and
        a second carrier substrate that is disposed opposite to the first carrier substrate being placed above the display portion, an opposing substrate being absent above an area in which the data-holding circuit is disposed,
        wherein a provider of the capacitance comprises a sense amplifier circuit for amplifying and latching a magnitude of an electric potential between two nodes;
        the sense amplifier circuit has a first and second latch circuit;
        the display device has
        a transmission control portion being provided that allows or disallows signal transmission between one of the two nodes and at least one of the first and second latch circuits; and
        the output voltage amplitude of the first latch circuit is less than the output voltage amplitude of the second latch circuit; and
    an electroconductive layer disposed around a periphery of the display device, a distance between the data-holding circuit and the electroconductive layer around the periphery of the display device being more than 100 times greater than a thickness of a dielectric body which constitutes the capacitance of the data-holding circuit.

2. The apparatus according to claim 1, wherein a distance between the data-holding circuit and the electro conductive layer around the periphery is more than 1,000 times greater than the thickness of the dielectric body which constitutes the capacitance of the data-holding circuit.

3. The apparatus according to claim 1, comprising:
    a dielectric layer being disposed between the display device and an inner wall of the apparatus, the dielectric layer being composed of a low-k material.

4. The apparatus according to claim 1, comprising:
    a dielectric layer being disposed between the display device and an inner wall of the apparatus, the dielectric layer being composed of air.

* * * * *